United States Patent [19]
Cerny et al.

[11] Patent Number: 6,066,865
[45] Date of Patent: *May 23, 2000

[54] SINGLE LAYER INTEGRATED METAL ENHANCEMENT MODE FIELD-EFFECT TRANSISTOR APPARATUS

[75] Inventors: Charles L. A. Cerny, Huber Heights; Christopher A. Bozada, Dayton; Gregory C. DeSalvo; John L. Ebel, both of Beavercreek; Ross W. Dettmer, Dayton; James K. Gillespie, Cedarville, all of Ohio; Charles K. Havasy, Laurel, Md.; Thomas J. Jenkins, Fairborn, Ohio; Kenichi Nakano; Carl I. Pettiford, both of Beavercreek, Ohio; Tony K. Quach; James S. Sewell, both of Kettering, Ohio; G. David Via, Dayton, Ohio

[73] Assignee: The United States of America as represented by the Secretary of the Air Force, Washington, D.C.

[*] Notice: This patent is subject to a terminal disclaimer.

[21] Appl. No.: 09/059,891

[22] Filed: Apr. 14, 1998

[51] Int. Cl.[7] .................................................. H01L 31/0328
[52] U.S. Cl. ........................... 257/194; 257/472; 257/744
[58] Field of Search ............................................... 257/194

[56] References Cited

U.S. PATENT DOCUMENTS

| | | |
|---|---|---|
| 3,764,865 | 10/1973 | Napoli et al. . |
| 3,855,690 | 12/1974 | Kim et al. . |
| 3,861,024 | 1/1975 | Napoli et al. . |
| 3,943,622 | 3/1976 | Kim et al. . |
| 4,961,194 | 10/1990 | Kuroda et al. . |
| 5,698,870 | 12/1997 | Nakano et al. . |
| 5,698,900 | 12/1997 | Bozada et al. . |
| 5,796,131 | 8/1998 | Nakano et al. . |
| 5,869,364 | 2/1999 | Nakano et al. . |
| 5,940,694 | 8/1999 | Bozada et al. . |
| 5,976,920 | 11/1999 | Nakano et al. . |

OTHER PUBLICATIONS

D. J. Gorney, J. B. Blake, H. C. Koons, M. Schulz, A. L. Vampola, R. L. Walterscheid, and J. R. Wertz, "The Space Environment and Survivability", Chapter 8 in *Space Mission Analysis and Design*, Second ed., W. J. Larson and J. R. Wertz eds., Microcosm, Inc., Torrance, CA, pp. 197–226, 1992.

F. B. McClean, "Interactions of Hazardous Environments with Electronic Devices", *Hardening Semiconductor Components Against Radiation and Temperature*, W. R. Dawes Jr., F. B. McClean, P. A. Robinson Jr., J. J. Silver, Noyes Data Corp., Park Ridge, NJ, pp. 1–71, 1989.

C. C. Messenger and M. S. Ash, in *The Effects of Radiation on Electronic Systems*, Van Nostrand Rheinhold Co., NY, pp. 266–322, 1986.

(List continued on next page.)

*Primary Examiner*—Olik Chaudhuri
*Assistant Examiner*—Douglas A. Wille
*Attorney, Agent, or Firm*—Gerald B. Hollins; Thomas L. Kundert

[57] ABSTRACT

An enhancement mode periodic table group III-IV semiconductor field-effect transistor device is disclosed. The disclosed transistor includes single metallization for ohmic and Schottky barrier contacts, a permanent non photosensitive passivation layer (a layer which has also been used for masking purposes during fabrication of the transistor) and a gate element of small dimension and shaped cross section as needed to provide desirable microwave spectrum electrical characteristics. The transistor of the invention is fabricated from undoped semiconductor materials disposed in a layered wafer structure and selectively doped by ion implantation to achieve either a p-channel or an n-channel transistor. The semiconductor materials may include two, one or zero buffer layers in their layer structure. The disclosed transistor is of reduced fabrication cost, increased dimensional accuracy and state of the art electrical performance.

25 Claims, 29 Drawing Sheets

OTHER PUBLICATIONS

R. Zuleeg, "Radiation Effects in GaAs FET Devices", Proc. of IEEE, vol. 77, pp. 389–407, 1989.

J. H. Cutchin, P. W. Marshall, T. R. Weatherford, J. Langworthy, E. L. Peterson, and A. B. Campbell, "Heavy Ion and Proton Analysis of a GaAs C–HIGFET SRAM", IEEE Trans. Nucl. Sci., vol. 40, pp. 1660–1665, 1993.

D. DiBitonto, W. Karpinski, K. Lubelsmeyer, D. Pandoulas, G. Pierschel, C. Rente, K. Subhani, and F. Tenbusch, "Radiation and Cryogenic Test Results with a Monolithic GaAs Preamplifier in C–HFET Technology", Nucl. Inst. Methods Phys. Res. A, vol. 350, pp. 530–537, 1994.

W. Karpinski, K. Lubelsmeyer, D. Pandoulas, G. Pierschel, C. Rente, K. Subhani, and F. Tenbusch, "Characteristics of GaAs Complementary Heterojunction FETs (C–HFETs) and C–HFET Based Amplifiers Exposed to High Neutron Fluences", Nucl. Inst. Methods Phys. Res. A, vol. 361, pp. 558–567, 1995.

R. Williams, Modern GaAs Processing Methods, 2nd ed., Artech House, Norwood, MA, pp. 260–270, 1990.

M. Hagio, S. Katsu, M. Kazumura, and G. Kano, "A New Self–Align Technology for GaAsAnalog MMIC's", IEEE Trans. on Elect. Dev., vol. 33, No. 6, pp. 754–758, Jun. 1986.

G. C. DeSalvo, T. K. Quach, R. W. Dettmer, K. Nakano, J. K. Gillespie, G. D. Via, J. L. Ebel, and C. K. Havasy, "Simplified Ohmic and Schottky Contact Formation for Field Effect Transistors Using the Single Layer Integrated Metal Field Effect Transistor", IEEE Trans. on Semi. Manufacturing, vol. 8, pp. 314–318, 1995.

C. K. Havasy, T. K. Quach, C. A. Bozada, G. C. DeSalvo, R. W. Dettmer, J. L. Ebel, K. Nakano, J. K. Gillespie, and G. D. Via, "A Highly Manufacturable 0.2 $\mu$m AlGaAs/InGaAs PHEMT Fabricated Using the Single–Layer Integrated–Metal FET (SLIMFET) Process", GaAs IC Symposium Proceedings, San Diego, CA, Oct. 29–Nov. 1, 1995, IEEE Press, Piscataway, NJ, pp. 89–92, 1995.

H. Kaakani, "GaAs CHFET Overview", Personal communication between Phillips Laboratory, Kirtland, AFB, NM and Honeywell Solid State Electronics Center, Plymouth, MN, Feb., 1995.

J. K. Abrokwah, J. H. Huang, W. Ooms, C. Shurboff, J. A. Hallmark, R. Lucero, J. Gilbert, B. Bernhardt, and G. Hansell, "A Manufacturable Complementary GaAs Process", 1993 IEEE GaAs IC Symposium Technical Digest, IEEE Press, Piscataway, NJ, pp. 127–130, 1993.

M. Meyer, "Digital GaAs", Compound Semiconductor, vol. 2, No. 5, pp. 26–32, 1996.

K. G. Merkel, C. L. A. Cerny, V. M. Bright, F. L. Schuermeyer, T. P. Monahan, R. T. Lareau, R. Kaspi, and A. K. Rai, "Improved p–channel InAlAs/GaAsSb HIGFET Using Ti/Pt/Au Ohmic Contacts to Beryllium Implanted GaAsSb", Solid State Electronics, vol. 39, pp. 179–191, 1996.

K. J. Chen, T. Enoki, K. Maezawa, K. Arai, and M. Yamatoto, "High–Performance In P–Based Enhancement–Mode HEMT's Using Non–Alloyed Ohmic Contacts and Pt–Based Buried–Gate Technologies", IEEE Trans. on Elect. Dev., vol. 43, No. 2, pp. 252–257, Feb. 1996.

J. M. Woodall et al., "Ohmic Contacts to n–GaAs Using Graded Band Gap Layers of $Ga_{1-x}In_x$ As Grown by Molecular Beam Epitaxy" J. Vacuum. Science. Technology. vol. 19, No. 3, Sep./Oct. 1981, p. 626.

S. Kuroda et al. "HEMT with Non–alloyed Ohmic Contacts Using $n^+$–InGaAs Cap Layer", IEEE Electron Device Letters, vol. EDL–8, No. 9, Sep. 1987, p. 389.

C. K. Peng et al., "Extremely Low Non–alloyed and Alloyed Contact Resistance Using an InAs Cap Layer on InGaAs by Molecular–Beam Epitaxy", J. Applied. Physics. vol. 64, No. 1, Jul. 1, 1988, p. 429.

T. Nittono et al., "Non–Alloyed Ohmic Contacts to n–GaAs Using Compositional Graded $In_xGa_{1-x}As$ Layers", Japanese Journal of Applied Physics, vol. 27, No. 9, Sep. 1988, pp. 1718–1722.

A. Ketterson et al., "Extremely Low Contact Resistances for AlGaAs/GaAs Modulation–Doped Field–Effect Transistor Structures", J. Applied. Physics. vol. 57, No. 6, p. 2305.

J. Sewell, C. Bozada, "A Combined Electron Beam/Optical Lithography Process Step for the Fabrication of Sub–Half Micron–Gate–Length MMIC Chips", Fourth National Technology Transfer Conference, National Aeronautics and Space Administration, Publication No. 3249, 1993, pp. 54–59.

P.W. Marshall, C.J. Dale, T.R. Weatherford, M. LaMacchia and K.A. LaBel, "Particle–Induced Mitigation of SEU Sensitivity in High Data Rate GaAs HIGFET Technologies", IEEE Trans. Nucl. Sci., vol. 42, pp. 1844–1849, 1995.

S. Kuroda et al., "A New Fabrication Technology for AlGaAs HEMT LSI's Using InGaAs Nonalloyed Ohmic Contacts", IEEE Trans. Nucl. Sci., vol. 36, pp. 2196–2203, 1989.

Stp 3 - Freon/O₂ RIE,
Form $Si_3N_4$ SubGate & Sidewalls

Stp 4 - Si$_3$N$_4$ Pattern for Align Mark Etch

Stp #4 / ML2
BCl₃ RIE Align Mark Etch

Stp #4 / ML2
Align Mark $Si_3 N_4$
Remove, Freon/$O_2$ RIE

Stp #4 / ML2
PR Remove to
Expose Dummy Gate Al

Stp #4 / ML2
Remove Dummy Gate Al,
$N_a$OH Etch

Stp 4 / ML3
PR Pattern for Charge carries Ion Implant

Stp 5 / ML3
Charge Carrier Ion Implant
P: 3-5x10$^{14}$ Be+Ions/cm$^2$, 35-50 KeV
N: 2-4x10$^{14}$ Si$^+$ Ions/cm$^2$, 75-100 KeV Step 6 / PR Remove, Rapid Thermal Anneal, 10 Sec at 750-800° C Stp 7 / ML 4
PR pattern for $O_2$ implant Stp 8 / ML 5
Gate Window PR Stp 9 / ML6
PR for EBOL
PR 1=PMMA A5.5, PR 2= PMMA E9,
PR 3= PMMA A5.5, PR4= 1813

Stp 9 / ML6
EBOL Large Feature Optical
Expose & Dev

Stp 9 / ML6
EBOL, Deep UV Expose of Patterned
E Beam PR

Stp 9 / ML6
Acetone Remove of 1813

Stp 9 / ML6
E Beam Define of T Gate

Stp 10 Metal Liftoff, PR Remove;
T Gate Complemenatary
 Pair Complete

SINGLE LAYER INTEGRATED METAL ENHANCEMENT MODE FIELD-EFFECT TRANSISTOR APPARATUS

CROSS REFERENCE TO RELATED PATENT DOCUMENTS

The present document is somewhat related to the copending and commonly assigned patent application documents "COMPLEMENTARY HETEROSTRUCTURE INTEGRATED SINGLE METAL TRANSISTOR APPARATUS", AFD 00281, Ser. No. 09/059,869; "COMPLEMENTARY HETEROSTRUCTURE INTEGRATED SINGLE METAL TRANSISTOR FABRICATION METHOD", AFD 00283, Ser. No. 09/059,890 and "SINGLE LAYER INTEGRATED METAL PROCESS FOR ENHANCEMENT MODE METAL SEMICONDUCTOR FIELD-EFFECT TRANSISTOR", AFD 00285, Ser. No. 09/059,892; which are all filed of even date herewith. The contents of these related even filing date applications are hereby incorporated by reference herein.

The present document is also somewhat related to the previously filed and commonly assigned patent application documents "METAL SEMICONDUCTOR FIELD-EFFECT TRANSISTOR (MESFET) DEVICE WITH SINGLE LAYER METAL", AFD 00156, Ser. No. 08/684,759; "SINGLE LAYER INTEGRATED METAL PROCESS FOR METAL SEMICONDUCTOR FIELD-EFFECT TRANSISTOR (MESFET)", AFD 00157, Ser. No. 08/684,760; "HIGH ELECTRON MOBILITY TRANSISTOR (HEMT) AND PSEUDOMORPHIC HIGH ELECTRON MOBILITY TRANSISTOR (PHEMT) DEVICES WITH SINGLE LAYER INTEGRATED METAL" AFD 00158, Ser. No. 08/684,756, now U.S. Pat. No. 5,698,870; "SINGLE LAYER INTEGRATED METAL PROCESS FOR HIGH ELECTRON MOBILITY TRANSISTOR (HEMT) AND PSEUDOMORPHIC HIGH ELECTRON MOBILITY TRANSISTOR (PHEMT)" AFD 00082, Ser. No. 08/684,761; "FIELD-EFFECT TRANSISTOR PROCESS WITH SEMICONDUCTOR MASK, SINGLE LAYER INTEGRATED METAL, AND DUAL ETCH STOPS" AFD 00169, Ser. No. 08/684,755; and "FIELD-EFFECT TRANSISTOR DEVICE WITH SINGLE LAYER INTEGRATED METAL AND RETAINED SEMICONDUCTOR MASKING" AFD 00170, Ser No. 08/684,734, now U.S. Pat. No. 5,698,900. The contents of these previously filed related applications are also hereby incorporated by reference herein.

RIGHT OF THE GOVERNMENT

The invention described herein may be manufactured and used by or for the Government of the United States for all governmental purposes without the payment of any royalty.

BACKGROUND OF THE INVENTION

This invention relates to field-effect transistor apparatus of the enhancement mode, p-channel or n-channel and periodic table group III-V material composition type.

The invention provides an enhancement mode field-effect transistor in which a single metallization step realizes the Schottky barrier gate contact and the ohmic junction source/drain contacts—a single metallization arrangement enabled in part by an unusual sequence of masking operations. The invention arises from compromise between several semiconductor device disciplines—including material growth, device metallization, and material deposition. The achieved field-effect transistor is technically and economically viable for use in digital and analog transistor applications including complementary transistor pairs useful into the microwave frequency range.

Several concepts appearing in the present invention also appear in the patent and publication literature as stand-alone concepts; concepts used in a different setting or concepts combined in less than the combination contemplated in the present invention. The present invention is, however, believed to represent a novel and unobvious combination of such concepts to achieve a useful result. The concept of using the same metal in parts of the source, drain and gate structure of a field-effect transistor, for example appears in a certain form in transistors fabricated some years ago when the self aligned gate structure was new in the art. Examples of this same metal usage appear, for example, in the two related patents of Napoli et al., U.S. Pat. Nos. 3,764,865 and 3,861,024. Same metal usage also appears in the two related patents of Kim, U.S. Pat. Nos. 3,855,690 and 3,943,622.

In each of these four patents however, the disclosed transistor involves use of a common metal to connect to an already formed source/drain ohmic contact and to form the Schottky barrier gate contact. In the silicon material used in the devices of these four patents an ohmic contact is moreover achieved with the mere addition of another layer of material and does not require the alloying, annealing and other complexities often used for many group III-V semiconductor device ohmic contacts. The present invention is believed distinguished over the disclosure of these older patents by its use of the same metal to actually form the gate contact as to form the source/drain contacts of the transistor. Moreover, in the present invention these source/drain contacts are achieved in a non-alloyed fashion.

The U.S. Pat. No. 4,961,194 of S. Kuroda et al., describes gallium arsenide MESFET and HEMT devices which use the combination of non-alloyed ohmic contacts, same metal electrodes, acetone solvent removal of photoresist coatings, ion implanted device separation areas and selective etching. Although each of these features may be used in the present invention, additional features not disclosed in the Kuroda et al. patent are also a part of the present invention and provide significant distinction over the Kuroda et al. disclosure. The Kuroda et al. patent, for example, does not disclose the use of a permanent secondary mask and passivation material layer nor the concept of a gate aperture recess received in a gate window as accomplished in applicants' invention. In view of the similar areas of work and in the interest of minimizing the size of the present patent document, the contents of the of S. Kuroda et al. U.S. Pat. No. 4,961,194 patent are hereby incorporated by reference herein.

An article published in the technical literature some years ago is also of interest with respect to the single metal concept and is additionally of interest with respect to the use of non-alloyed ohmic contacts in a field-effect transistor. This article, "A New Fabrication Technology for AlGaAs/GaAs HEMT LSI's Using InGaAs Non-alloyed Ohmic Contacts", is authored by S. Kuroda et al., apparently the same S. Kuroda et al., as appears in the above identified U.S. Pat. No. 4,961,194, and appears at page 2196 in the Institute of Electrical and Electronic Engineers Transactions on Electron Devices, Volume 36, number 10, October, 1989. This Kuroda article is in fact of an especially enlightening contrast in nature with respect to the present invention since it teaches the use of a complex etching sequence during formation of the transistor elements and the present invention avoids use of this sequence in favor of a more practical and less costly procedure.

In a somewhat related situation the technical article "All-Refractory GaAs FET Using Amorphous TiWSi$_x$ Source/Drain Metalization and Graded In$_x$Ga$_{1-x}$As Layers" authored by N. Papanicolaou which appears at page 7 in the Institute of Electrical and Electronic Engineers Electron Devices Letters, volume 15, number 1, January, 1994 discloses the use of non-alloyed ohmic contacts in a gallium arsenide field-effect transistor. The Papanicolaou article however, relates to the fabrication of a high temperature field-effect transistor device, a device having refractory metal elements and involving the use of Tungsten metal. The Papanicolaou article also presents an informative discussion of the non-alloyed ohmic contact art.

The inventors of the present invention have also found the textbook "Modern GaAs Processing Methods" authored by Ralph Williams, Artech House, of Boston and London, to be of assistance in explaining and understanding certain aspects attending the present invention including its relationship with the prior art. In the further interest of minimizing the size of the present patent document, the contents of the Ralph Williams, Artech House textbook are therefore hereby incorporated by reference herein.

Although each of these documents from the prior art may relate to an aspect of the present invention it is believed that the invention as described herein represents the first combination of the plurality of concepts and compromises necessary to achieve a successful single metal, non-alloyed contact, selective etching-achieved, and secondary mask-inclusive field-effect transistor.

Non-alloyed ohmic contacts and other features relating to the present invention are additionally disclosed in several technical articles as follows.

[1] D. J. Gorney, J. B. Blake, H. C. Koons, M. Schulz, A. L. Vampola, R. L. Walterscheid, and J. R. Wertz, "The Space Environment and Survivability", Chapter 8 in *Space Mission Analysis and Design,* Second ed., W. J. Larson and J. R. Wertz eds., Microcosm, Inc., Torrance, Calif., pp. 197–226, 1992.

[2] F. B. McClean, "Interactions of Hazardous Environments with Electronic Devices", in *Hardening Semiconductor Components Against Radiation and Temperature,* W. R. Dawes Jr., F. B. McClean, P. A. Robinson Jr., J. J. Silver, Noyes Data Corp., Park Ridge, N.J., pp. 1–71, 1989.

[3] C. C. Messenger and M. S. Ash, in *The Effects of Radiation on Electronic Systems,* Van Nostrand Rheinhold Co., NY, pp. 266–322, 1986.

[4] R. Zuleeg, "Radiation Effects in GaAs FET Devices", Proc. of IEEE, vol. 77, pp. 389–407, 1989.

[5] J. H. Cutchin, P. W. Marshall, T. R. Weatherford, J. Langworthy, E. L. Peterson, and A. B. Campbell, "Heavy Ion and Proton Analysis of a GaAs C-HIGFET SRAM", IEEE Trans. Nucl. Sci., vol. 40, pp. 1660–1665, 1993.

[6] D. DiBitonto, W. Karpinski, K. Lubelsmeyer, D. Pandoulas, G. Pierschel, C. Rente, K. Subhani, and F. Tenbusch, "Radiation and Cryogenic Test Results with a Monolithic GaAs Preamplifier in C-HFET Technology", Nucl. Inst. Methods Phys. Res. A, vol. 350, pp. 530–537, 1994.

[7] W. Karpinski, K. Lubelsmeyer, D. Pandoulas, G. Pierschel, C. Rente, K. Subhani, and F. Tenbusch, "Characteristics of GaAs Complementary Heterojunction FETs (C-HFETs) and C-HFET Based Amplifiers Exposed to High Neutron Fluences", Nucl. Inst. Methods Phys. Res. A, vol. 361, pp. 558–567, 1995.

[8] R. Williams, Modern GaAs Processing Methods, 2nd ed., Artech House, Norwood, Mass., pp. 260–270, 1990.

[9] M. Hagio, S. Katsu, M. Kazumura, and G. Kano, "A New Self-Align Technology for GaAsAnalog MMIC's", IEEE Trans. on Elect. Dev., vol. 33, no. 6, pp. 754–758, June 1986.

[10] G. C. DeSalvo, T. K. Quach, R. W. Dettmer, K. Nakano, J. K. Gillespie, G. D. Via, J. L. Ebel, and C. K. Havasy, "Simplified Ohmic and Schottky Contact Formation for Field Effect Transistors Using the Single Layer Integrated Metal Field Effect Transistor", IEEE Trans. on Semi. Manufacturing, vol. 8, pp. 314–318, 1995.

[11] C. K. Havasy, T. K. Quach, C. A. Bozada, G. C. DeSalvo, R. W. Dettmer, J. L. Ebel, K. Nakano, J. K. Gillespie, and G. D. Via, "A Highly Manufacturable 0.2 μm AlGaAs/InGaAs PHEMT Fabricated Using the Single-Layer Integrated-Metal FET (SLIMFET) Process", GaAs IC Symposium Proceedings, San Diego, Calif., Oct. 29–Nov. 1, 1995, IEEE Press, Piscataway, N.J., pp. 89–92, 1995.

[12] H. Kaakani, "GaAs CHFET Overview", Personal communication between Phillips Laboratory, Kirtland, AFB, N.M. and Honeywell Solid State Electronics Center, Plymouth, Minn., February, 1995.

[13] J. K. Abrokwah, J. H. Huang, W. Ooms, C. Shurboff, J. A. Hallmark, R. Lucero, J. Gilbert, B. Bernhardt, and G. Hansell, "A Manufacturable Complementary GaAs Process", 1993 IEEE GaAs IC Symposium Technical Digest, IEEE Press, Piscataway, N.J., pp. 127–130, 1993.

[14] M. Meyer, "Digital GaAs", Compound Semiconductor, vol. 2, no. 5, pp. 26–32, 1996.

[15] K. G. Merkel, C. L. A. Cerny, V. M. Bright, F. L. Schuermeyer, T. P. Monahan, R. T. Lareau, R. Kaspi, and A. K. Rai, "Improved p-channel InAlAs/GaAsSb HIGFET Using Ti/Pt/Au Ohmic Contacts to Beryllium Implanted GaAsSb", Solid State Electronics, vol. 39, pp. 179–191, 1996.

[16] K. J. Chen, T. Enoki, K. Maezawa, K. Arai, and M. Yamatoto, "High-Performance InP-Based Enhancement-Mode HEMT's Using Non-Alloyed Ohmic Contacts and Pt-Based Buried-Gate Technologies", IEEE Trans. on Elect. Dev., vol. 43, no. 2, pp. 252–257, February, 1996.

[17] J. M. Woodall et al., "Ohmic Contacts to n-GaAs Using Graded Band Gap Layers of Ga$_{1-x}$In$_x$As Grown by Molecular Beam Epitaxy" J. Vacuum Science Technology, Vol 19, number 3, September/October 1981, pp 626.

[18] S. Kuroda et al. "HEMT with Non-alloyed Ohmic Contacts Using n$^+$-InGaAs Cap Layer", IEEE Electron Device Letters, Volume EDL-8, number 9, September 1987, pp 389.

[19] C. K. Peng et al., "Extremely Low Non-alloyed and Alloyed Contact Resistance Using an InAs Cap Layer on InGaAs by Molecular-Beam Epitaxy", J. Applied Physics, Volume 64, number 1, Jul. 1, 1988, pp 429.

[20] T. Nittono et al., "Non-Alloyed Ohmic Contacts to n-GaAs Using Compositional Graded In$_x$Ga$_{1-x}$As Layers", Japanese Journal of Applied Physics, Volume 27, number 9, September 1988, pp 1718–1722.

[21] A. Ketterson et al., "Extremely Low Contact Resistances for AlGaAs/GaAs Modulation-Doped Field-Effect Transistor Structures", J. Applied Physics, Volume 57, number 6, pp 2305.

[22] J. Sewell, C. Bozada, "A Combined Electron Beam/Optical Lithography Process Step for the Fabrication of Sub-Half Micron-Gate-Length MMIC Chips", Fourth National Technology Transfer Conference, National Aeronautics and Space Administration, Publication Number 3249, 1993, pp 54–59.

Although each of these documents from the prior art may therefore relate to an aspect of the present invention, it is believed the invention as described herein represents the first combination of the plurality of concepts and compromises necessary to achieve a successful single metal, non-alloyed contact, inorganic secondary mask-aided, radiation resistant, low power requirement and microwave-capable enhancement mode field-effect transistor.

The above identified previously filed and commonly assigned patent application documents are also of interest with respect to the present invention in the sense that they disclose field-effect transistors of the MESFET and related types and the fabrication of these transistors using single metallization secondary mask-inclusive processing. Notably, however, the transistors of these previously filed and commonly assigned documents are of the n-channel depletion mode type wherein electron charge carriers are utilized and, moreover, these transistors are fabricated through use of diffusion dopings in layers of the transistor rather than controlled implanted dopings in initially non-doped layers as enable the present invention.

SUMMARY OF THE INVENTION

The present invention provides a single metallization n-channel or p-channel enhancement mode field-effect transistor of simplified structure, microwave frequency capability, periodic table group III-V material composition and low cost. The disclosed transistor employs a single common metallization for the Schottky gate and ohmic contact electrodes in each of the possible two transistor types and may incorporate physical features smaller than those achievable with optical lithography. The invention additionally includes a structural element, a permanent masking/electrically insulating/passivating layer, and related processing steps useful during a fabrication sequence and eventually comprising an element of the completed transistor.

It is an object of the present invention, therefore, to provide a low cost microwave field-effect transistor.

It is another object of the invention to provide a low power consumption field-effect transistor of the enhancement mode and higher electrical efficiency type.

It is another object of the invention to provide field-effect transistor structure wherein p-channel and n-channel transistors can coexist in the same wafer.

It is another object of the invention to provide a field-effect transistor in which desirably low electrical resistance exists in the source and drain electrical current paths.

It is another object of the present invention to provide a field-effect transistor in which the Schottky gate element and the transistor drain/source ohmic contact elements are of the same metal.

It is another object of the invention to provide a gallium arsenide field-effect transistor having indium gallium arsenide cap layer-enabled non-alloyed ohmic contacts of low electrical contact resistance.

It is another object of the invention to provide an enhancement mode field-effect transistor having a permanent secondary mask/passivation layer of silicon nitride or silicon dioxide.

It is another object of the invention to provide an enhancement mode field-effect transistor of small gate size and other microwave-capable structural features.

It is another object of the invention to provide an enhancement mode field-effect transistor.

Additional objects and features of the invention will be understood from the following description and claims and the accompanying drawings.

These and other objects of the invention are achieved by a periodic table group III-V semiconductor material enhancement mode field-effect transistor comprising the combination of:

a plurality of undoped periodic table group III-V semiconductor material layers received on a substrate member;

a masking inorganic dielectric material layer covering an outermost of said semiconductor material layers and having selected mask apertures therein;

said masking dielectric material layer-covered semiconductor material layers including a buried, charge carrier-communicating, field-effect transistor channel layer;

a gate window aperture through at least one semiconductor layer covering said channel layer, said gate window aperture being in registration with one of said masking inorganic dielectric material layer mask apertures;

a Schottky barrier gate element received in charge carrier flow-controlling proximity of said channel layer in said gate window aperture;

source and drain current conductor elements located on charge carrier flow upstream and downstream sides of said gate window aperture and each comprising aligned stacks of locally doped successive layer semiconductor material extending between stack ends at said outermost semiconductor material layer and said channel layer;

source and drain ohmic contact elements received on said outermost semiconductor material layer each in registration with other non-gate of said mask apertures and in electrical connection therein with one of said current conductor outermost semiconductor material layer stack ends;

said gate element and said source and drain ohmic contact elements being comprised of a same metallic common composition.

BRIEF DESCRIPTION OF THE DRAWINGS

FIG. 2I shows the FIG. 2H structure after additional processing.

FIG. 2O shows the FIG. 2N structure after additional processing.

FIG. 2AA shows the FIG. 2Z structure after additional processing.

DETAILED DESCRIPTION

Figure 1:
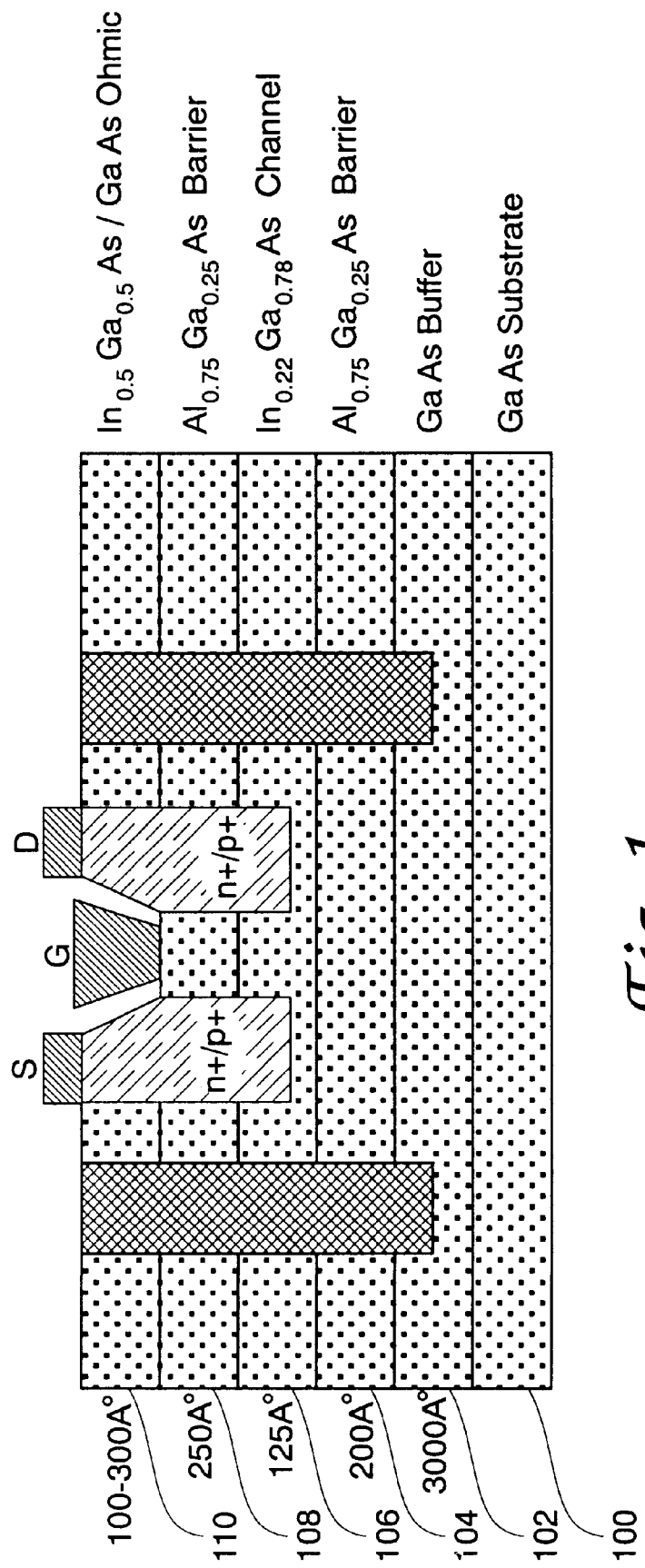
FIG. 1 shows a detailed cross sectional view of a field-effect transistor in accordance with the invention.
Figure 2A:
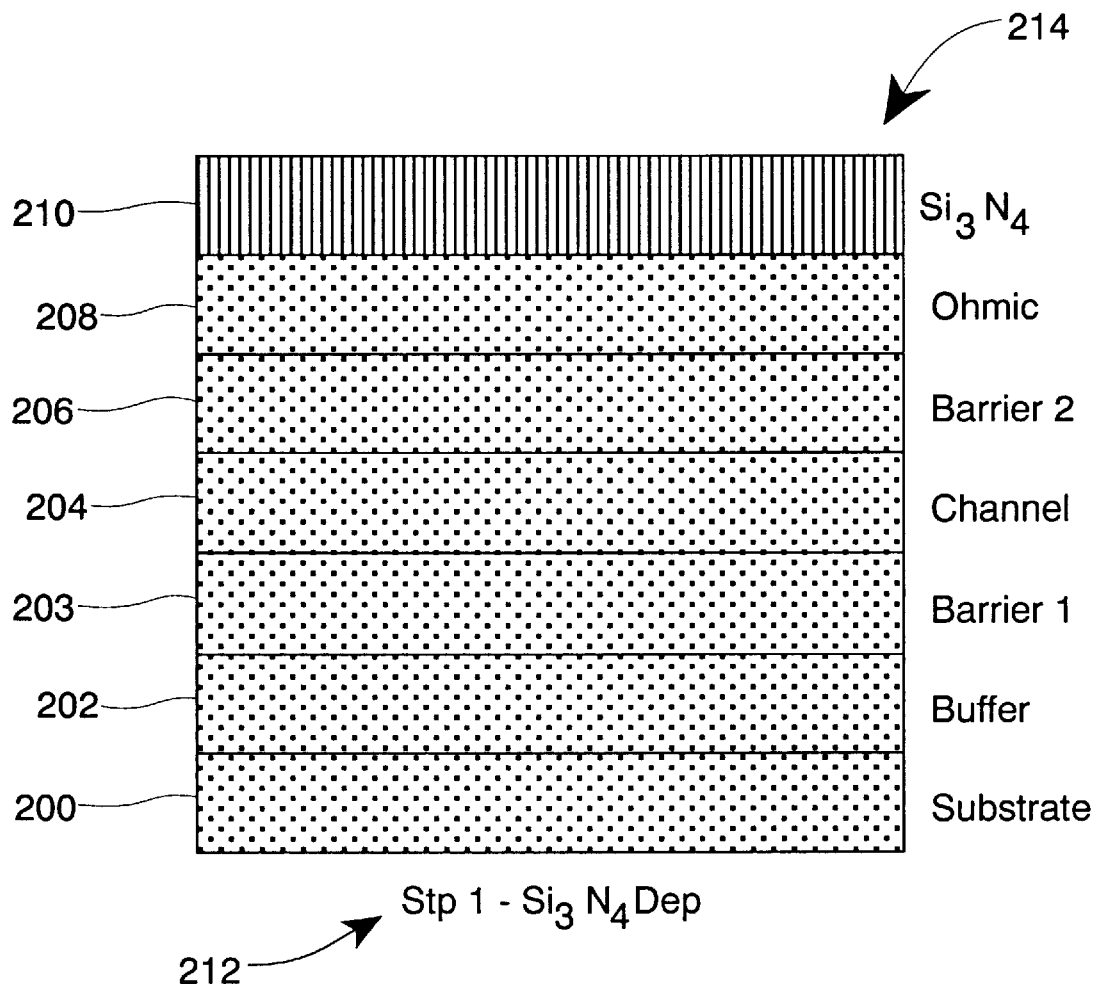
FIG. 2A shows an initial wafer structure usable to achieve the FIG. 1 field-effect transistor.

FIG. 2 in the drawings shows in the twenty seven views of FIG. 2A through FIG. 2AA a fabrication sequence cross sectional layer representation of a periodic table group III-IV semiconductor material field-effect transistor made according to the present invention. Fabrication of an enhancement mode transistor according to the invention may start with a wafer of, for example, gallium arsenide semi-insulating semiconductor substrate material such as the substrate member 200 in FIG. 2A or with a wafer having each of the several layers represented in FIG. 2A previously formed. Wafers having all of the semiconductor material layers represented in FIG. 2A may be obtained to specification, including the wafer layer compositions and thickness shown in greater detail in FIG. 1, from several suppliers to the integrated circuit art or alternatively fabricated locally. Suppliers such as Picogiga Corporation and QED Incorporated may be used as a source of such wafers. Wafers having some intermediate number of predisposed layers should also be available from such sources. Selection from several possible starting point options is therefore primarily a matter of available resources and economic considerations in fabricating devices according to the invention. Significantly, each of the semiconductor layers shown in the FIG. 1 and FIG. 2 drawings are in an initially non-doped status as is known to be desirable in the art of fabricating enhancement mode field-effect transistors. These layers receive selected dopings in limited layer areas during the present process by way of several ion implantation processing steps described below.

In the FIG. 2A cross sectional view of a wafer segment, a field-effect transistor channel layer 204 is shown to be received on a barrier one layer 203. The barrier one layer is carried on a buffer layer 202 that is in turn supported by a substrate 200. The channel layer 204 is covered by a barrier two layer 206 then an ohmic contact layer 208. The semiconductor layers of the FIG. 2A wafer 214 may typically be comprised of the gallium arsenide inclusive materials indicated in the FIG. 1 drawing and may have the thickness also indicated in the FIG. 1 drawing. As is known in the periodic table group III-V material field-effect transistor art, it is usually desirable to isolate the channel layer of a field-effect transistor device between overlying and underlying barrier layers as shown at 206 and 203 in FIG. 2A. This arrangement limits carrier migration into adjacent layers of the device during high temperature, ionizing radiation or other extreme operating conditions; the overlaying and underlying barrier layers one and two in the FIG. 2A drawing may be used for this purpose. The indication of indium gallium arsenide/gallium arsenide material for the ohmic contact layer 110 in FIG. 1 represents use of a thin initial seed layer of the indium gallium arsenide material followed by a layer of gallium arsenide material. This initial seed indium gallium arsenide layer may be of a thickness of thirty angstroms. The subscript numbers following the indium and gallium materials in these layers and the similar numbers for other FIG. 1 layers of course represent component fractions.

The FIG. 1 and FIG. 2 wafers, in fact, comprise what has become known in the art as a "heterostructure"—in view of their inclusion of the three layer sandwich represented by the FIG. 1 layers 104, 106, and 108 or the FIG. 2 layers 203, 204, and 206—i.e., a channel layer residing between two charge carrier confinement barrier layers. As may be appreciated from the layer thickness dimensions shown in FIG. 1 the buffer layer 102 and 202 is not shown to scale in these drawings since it is preferably made to be over ten times the thickness of the adjacent barrier layer at 104, 203. In a related manner the thickness of the substrate layer 100, 200 is often even greater than that of the buffer layer but is unspecified in the present discussion. Omission of the break lines or greater thickness showings of these layers is believed to be an acceptable reader and drawing convenience. In a related manner drawing scale relationships are generally not observed in many of the drawings of the present document.

Although use of the heterostructure barrier layers 203 and 206 is found desirable in some devices made in accordance with the invention, it will be understood by persons skilled in the periodic table group III-V semiconductor device art that use of such layers is not always required and that the present device may indeed be fabricated on wafers devoid of one or both of these layers. Such devices may exhibit altered electrical characteristics especially with respect to charged carrier leakage from the transistor channel layer—and therefore incur greater turned-off current flow for example. Devices of this type may be less useful in the typically long term and energy limited applications of outer space for another example but may also be well suited to other applications, such as cost-influenced consumer goods operated from public utility energy sources.

As set forth in certain of the claims of this document, the present invention is considered to relate to devices including one or more of the heterostructure layers 203 and 206 and also to devices omitting such layers. Devices which omit both or one of the layers 203 and 206 are in a strict sense no longer of the heterostructure type and are in fact more in the nature of MESFET transistor devices. Since the inclusion of layers 203 and 206 provides the most desirable transistor characteristics and most complex transistors, the present discussion focuses on such devices. Alterations of the disclosed layer 203 and 206-included structure and process—alterations to the simplified MESFET arrangement are believed then within the capability of persons skilled in the art.

The buffer layer 202 of the FIG. 2A drawing serves as a crystallographic interface between the lattice structure of the substrate 200 and the possibly differing lattice structure of the higher layers including the channel layer 204. The substrate 200 is preferably made from gallium arsenide material; however, device fabrication starting with other substrate materials is believed possible. The single crystal or epitaxial layers of the wafer 214 can be accomplished using either molecular beam epitaxy (MBE), metal organic chemical vapor deposition (MOCVD) or possibly other related growth techniques if the local fabrication option is used.

Added to the semiconductor material layers of the FIG. 2A wafer 214 is a topmost layer 210 of silicon nitride material, $Si_3N_4$, a "secondary mask layer", which is to serve several useful purposes during the course of the following transistor fabrication sequence and in the fabricated transistor. The secondary mask layer 210 in fact serves generally as a combined source material for mask elements used in subsequent fabrication steps, as a selectively removable masking material which is nonresponsive to photoresist etchants, as a masking element which is non-photoresponsive, as a heat resistant electrical insulator on which, for example, metallic conducting material can be deposited and as a permanent covering layer which is not detrimental to performance in the completed transistor. Since a major part of this secondary mask layer 210 remains in the finished transistor, it also provides a desirable degree of passivation and protection of the completed transistors' exposed surface (i.e., the non-metal covered surface portions) from contamination and physical damage.

Indeed without the masking capabilities arising from this secondary mask layer 210, and especially the later described benefits of such a mask in precluding a critical mask realignment operation, the benefits of the present invention could not be achieved. The silicon nitride material of layer 210 may be deposited over the semiconductor material layers of the wafer 214 using a plasma enhanced chemical vapor deposition (PECVD) sequence and is preferably deposited to an initial thickness of five thousand angstroms. Silicon dioxide material is viewed as a possible substitute for this silicon nitride material in the layer 210 when the appropriate processing equipment is available. These inorganic materials are also materials which can be selectively removed from specific areas of the secondary mask layer 210 without harm to adjacent or underlying portions of the transistor in a later portion of the fabrication sequence.

The present invention uses InGaAs or other low energy bandgap material in the FIG. 1 and FIG. 2 ohmic contact layers 110 and 208 in order to form non-alloyed ohmic contacts using Schottky refractory metallization procedures. The FIG. 2A step depicts addition of the silicon nitride material layer 210 to the underlying semiconductor material layers. This accomplishment in the FIG. 2A drawing is indicated in abbreviated and step-numbered form by the legend at 212 in FIG. 2A. Legends of the 212 type appear in each of the subsequent FIG. 2 drawings; mask identification numbers are included where appropriate.

Figure 2B:
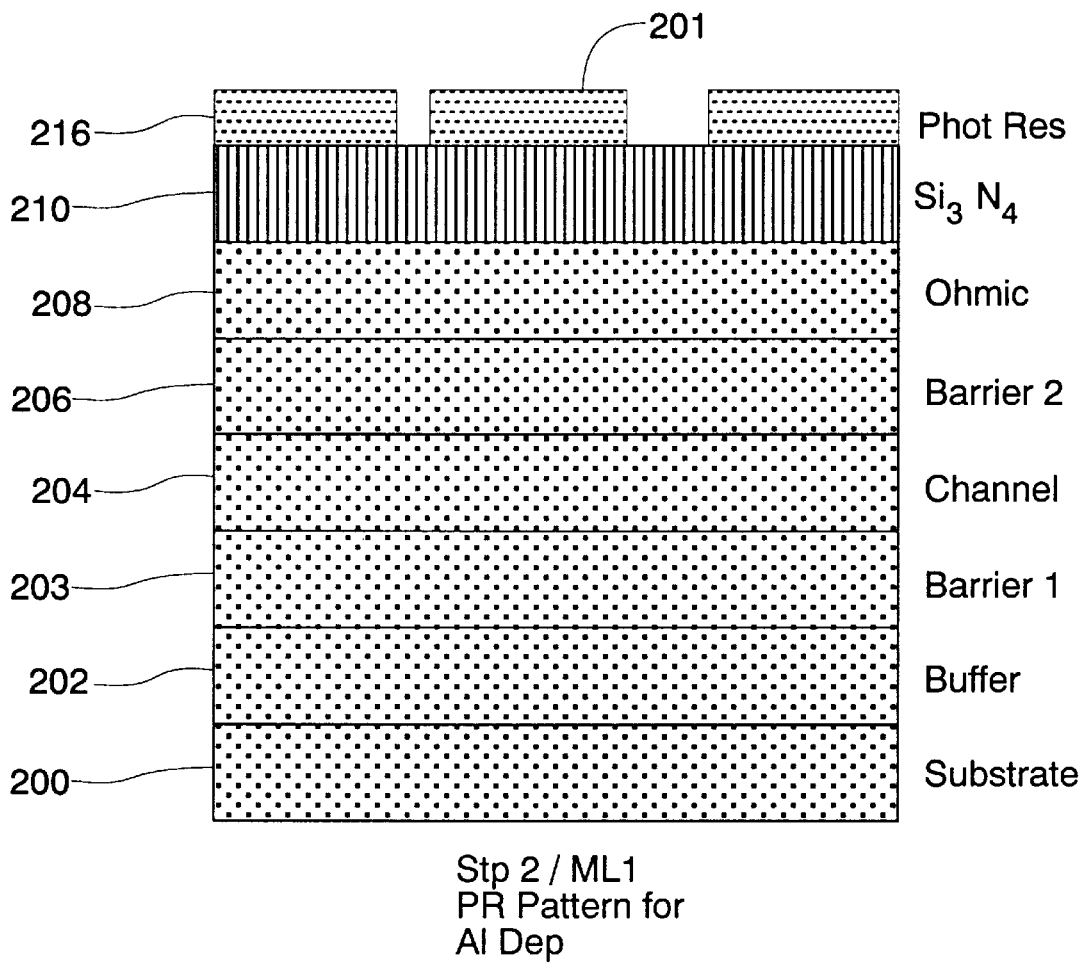
FIG. 2B shows the FIG. 2A structure after additional processing.

Continuing with a discussion of the successive drawings in the FIG. 2 series, in FIG. 2B the addition of a first layer of photoresist material 216 to the FIG. 2A wafer is represented. As implied by the shading used for this photoresist 216, a dotted line symbol of several different variations is used in the drawings of the present document to represent different photoresist materials—this is especially accomplished when differing photoresist materials are present in a single drawing. The FIG. 2B step is also deemed to include the lithographic process of configuring this first layer photoresist material into a desired pattern for a temporary aluminum mask metal deposition step. The legend in FIG. 2B indicates the photoresist material 216 to comprise mask level 1 and the accomplished changes comprise step 2 in the FIG. 2 process sequence. The photoresist deposited in the FIG. 2B step may be of the 1813 type and may have a thickness of one and three tenths micrometer or 13,000 angstroms. This type of photoresist may also be used in each of the unspecified portions of the FIG. 2 sequence, i.e., in the portions wherein no other photoresist material is identified herein. Later parts of the FIG. 2 sequence use other specific photoresist materials, often in multiple layer combinations of resist; such additional photoresist materials are expressly identified at the time of use.

Figure 2C:
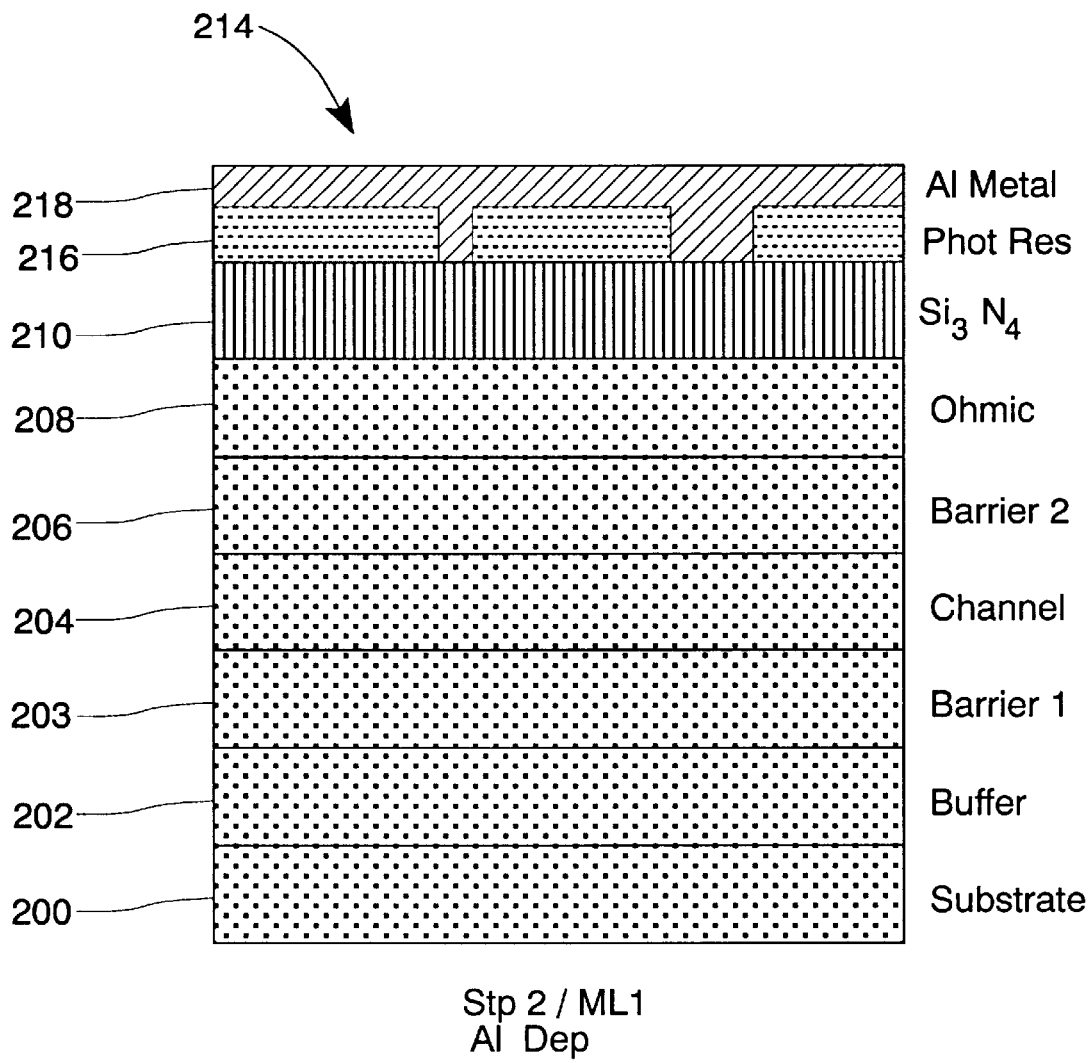
FIG. 2C shows the FIG. 2B structure after additional processing.

The deposition of an aluminum metal layer 218 over the configured photoresist material 216 is represented in the FIG. 2C drawing; an initial aluminum thickness of two hundred angstroms is used and deposition by a thermal evaporation process is satisfactory. The aluminum metal deposited in the FIG. 2C step is ultimately used to form silicon nitride material alignment marks useful during subsequent processing steps of the wafer 214 and also to define a transistor gate region as will become apparent. Use of the silicon nitride material of layer 210 as a mask and support for the temporary aluminum metal layer 218 comprises a first of several uses of the silicon nitride layer in the sequence of the present invention.

The just recited thickness dimensions of 13,000 angstroms and 250 angstroms for the photoresist layer 216 and the aluminum metal layer 218 illustrate again drawing scale liberties included in the present document. Since these two layers actually have a thickness ratio of 52:1, a drawing made to precise scale should represent the metal layer 218 as a very thin line in comparison with the representation of photoresist layer 216 shown (photoresist layer 216 is actually of the greatest thickness of any layer above substrate 200 in FIG. 2C). In addition to other difficulties, such a drawing would not meet Patent and Trademark Office drawing requirements with respect to line thickness and perhaps other details. With the actual dimensions provided and the caution urged by this and similar recitations regarding incorporated drawing liberties, it is believed a person skilled in the integrated circuit art can comprehend the nature of the present invention notwithstanding such drawing liberties and conveniences. As is known in the integrated circuit metal liftoff art, moreover, the actual relatively thin nature of the metal layer 218 as opposed to the illustrated overly thick nature of this layer shown in FIG. 2C is desirable to satisfactorily accomplish the metal liftoff separation described later in the FIG. 2 sequence.

Figure 2D:
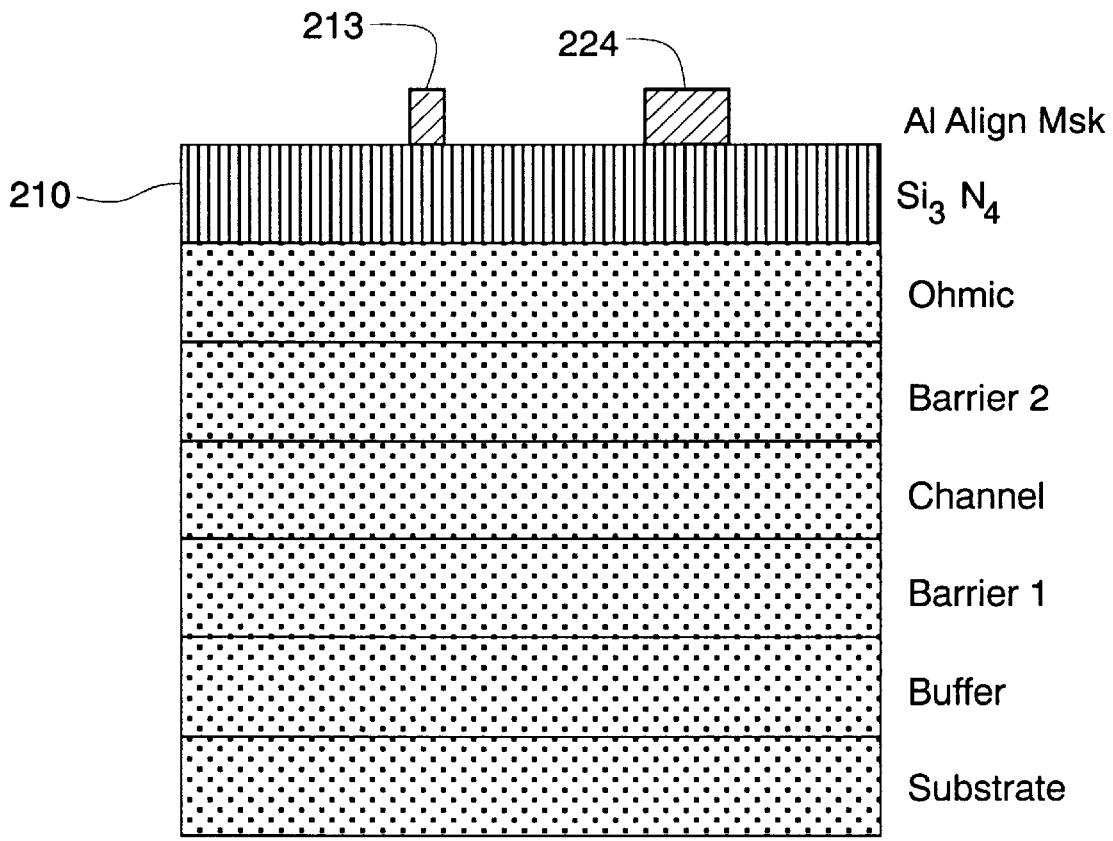
FIG. 2D shows the FIG. 2C structure after additional processing.

Following liftoff of unused portions of the FIG. 2C aluminum metal layer 218 (by use of acetone dissolution of the underlying 1813 photoresist) the desired aluminum mask elements preliminarily appear at 213 and 224 in the FIG. 2D drawing. Etching away of a mask element-unprotected thickness portion of the silicon nitride material layer 210 is then accomplished using the aluminum mask elements 213 and 224 to define silicon nitride material mask elements registered with these aluminum mask elements—as are represented at 233 and 230 in FIG. 2E. A reactive ion etch using a combination of Freon® and oxygen ions at a temperature of 300 degrees Kelvin, a 45/2 sccm mix and pressure of forty millitorr can be used to achieve the FIG. 2E silicon nitride material removal and provide the wafer cross sectional appearance shown. Notably following this FIG. 2E step the sidewalls of the gate-related silicon nitride element 233 below mask element 213 are of a sloping nature as are the sidewalls of the alignment mark-related silicon nitride element 230 below the mask element 224. With respect to element registrations it is additionally notable in the FIG. 2E step that a single mask (as used in the FIG. 2B step) has been employed to define locations for the silicon nitride material elements 233 and 230 in the FIG. 2E drawing.

Figure 2E:
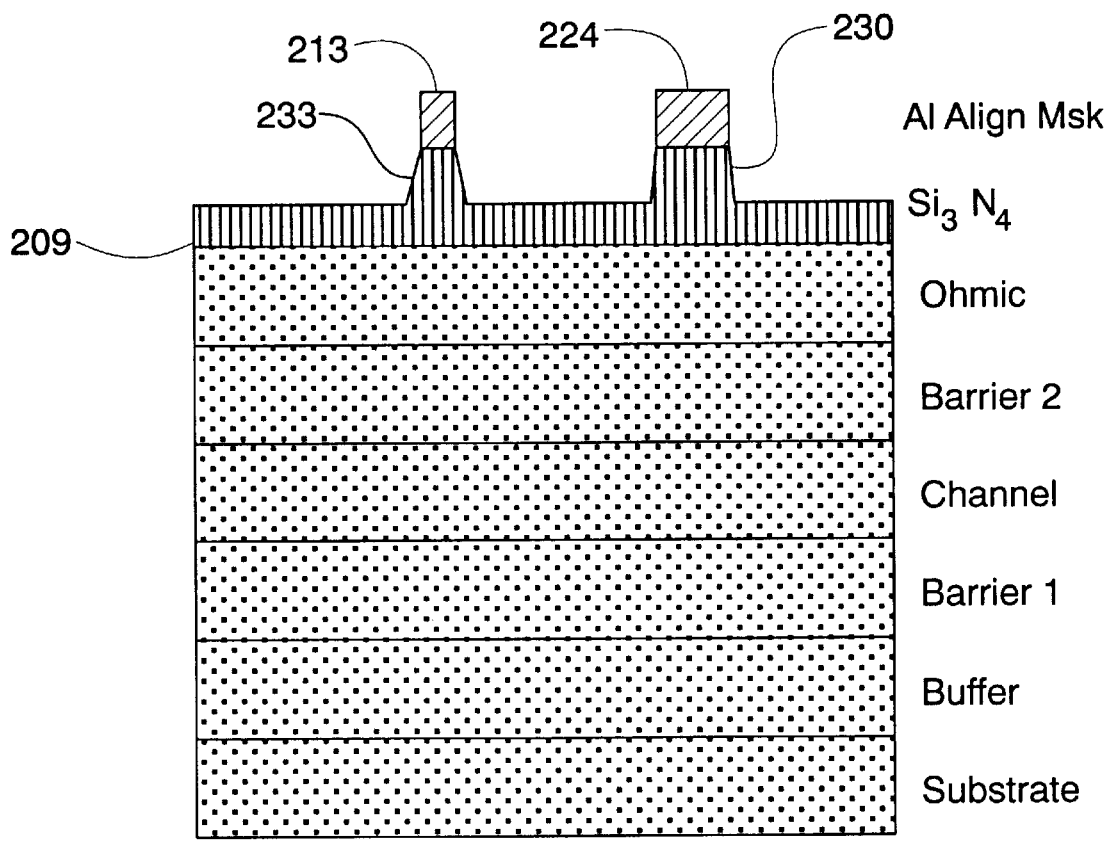
FIG. 2E shows the FIG. 2D structure after additional processing.

The silicon nitride material mask elements 233 and 230 have been identified by the name of "substitutional gate" or "subgate mask" by the present inventors. The sloping sidewall shapes of the subgate mask elements 233 and 230 as are achieved by the reactive ion etching sequence accomplished in the FIG. 2E step are found desirable during subsequent ion implant processing of the transistor. These sloping sidewall mask elements are of course determined as to location and shape by the aluminum metal mask element 213. Use of the silicon nitride material of layer 210 to comprise sloping sidewall mask elements is deemed a second use of this material in the present invention. The step accomplished in FIG. 2E is identified as a "subgate thinning" of the silicon nitride layer—in view of its relation to the substitutional gate mask elements. The portion of the silicon nitride material layer 210 remaining after the subgate thinning operation of FIG. 2E is a mask layer of silicon nitride of preferably about 1000 angstroms thickness and is identified by the number 209. This mask layer comprises a secondary mask and also has multiple function utility during ensuing parts of the FIG. 2 sequence as is noted in the narration below. A portion of this silicon nitride material 209 in fact remains present in the completed transistors as may be observed at 281 in the final FIG. 2AA drawing of the FIG. 2 series.

Figure 2F:
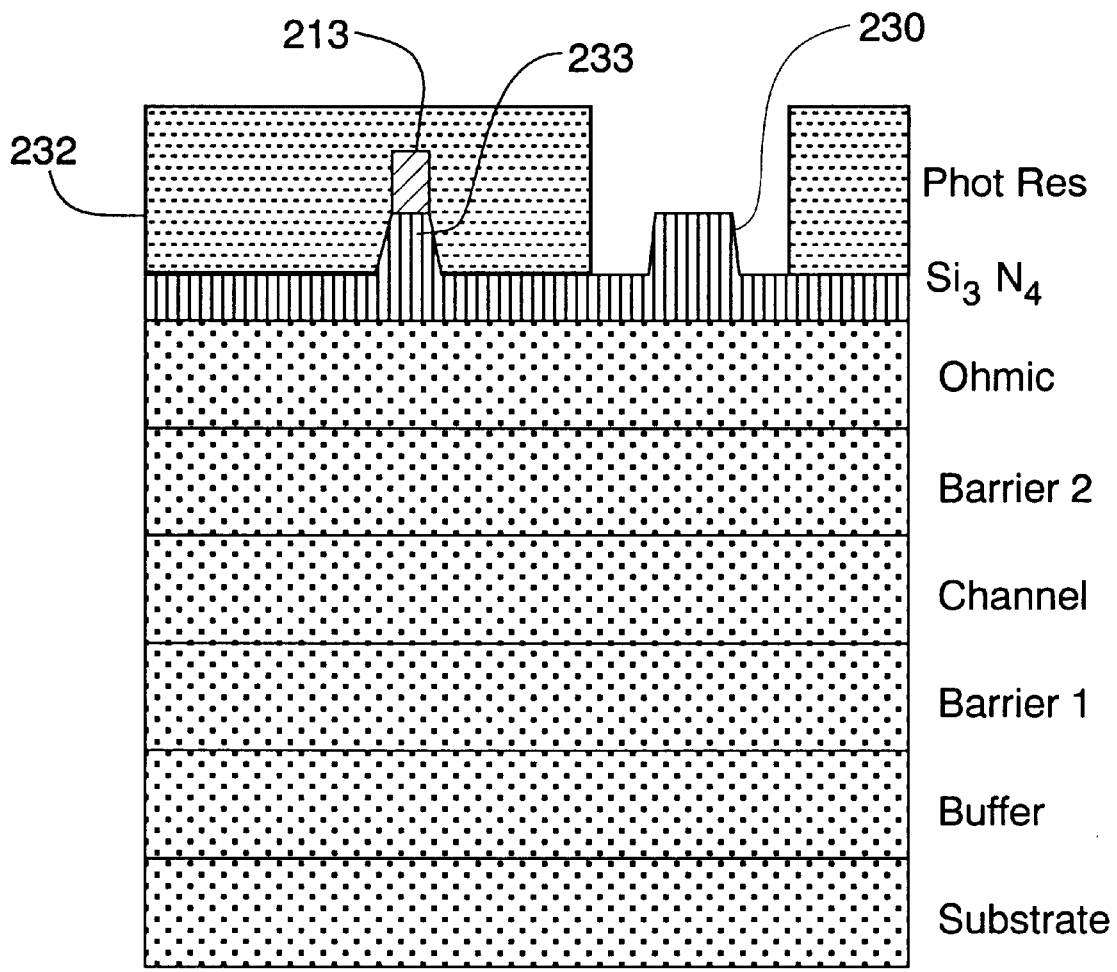
FIG. 2F shows the FIG. 2E structure after additional processing.

In the FIG. 2F step a layer of photoresist 232 has been applied to protect the aluminum mask element 213 and the mask elements 233 and 230 and this photoresist has been removed by a routine lithographic and etching sequence in the region over the alignment mark mask element 230. The aluminum mask element at 224 has also been removed to leave the underlying and shaped silicon nitride mask element 230 in the FIG. 2F step. This silicon nitride material at 230 comprises mask level 2 in the FIG. 2 sequence as identified in FIG. 2G and this service as mask level 2 is a third function of the silicon nitride material in the present transistor fabrication sequence. The aluminum mask element 224 removal step may be accomplished with a one molar sodium hydroxide solution at a temperature of 300 degrees Kelvin and a pressure of 760 Torr.

Figure 2G:
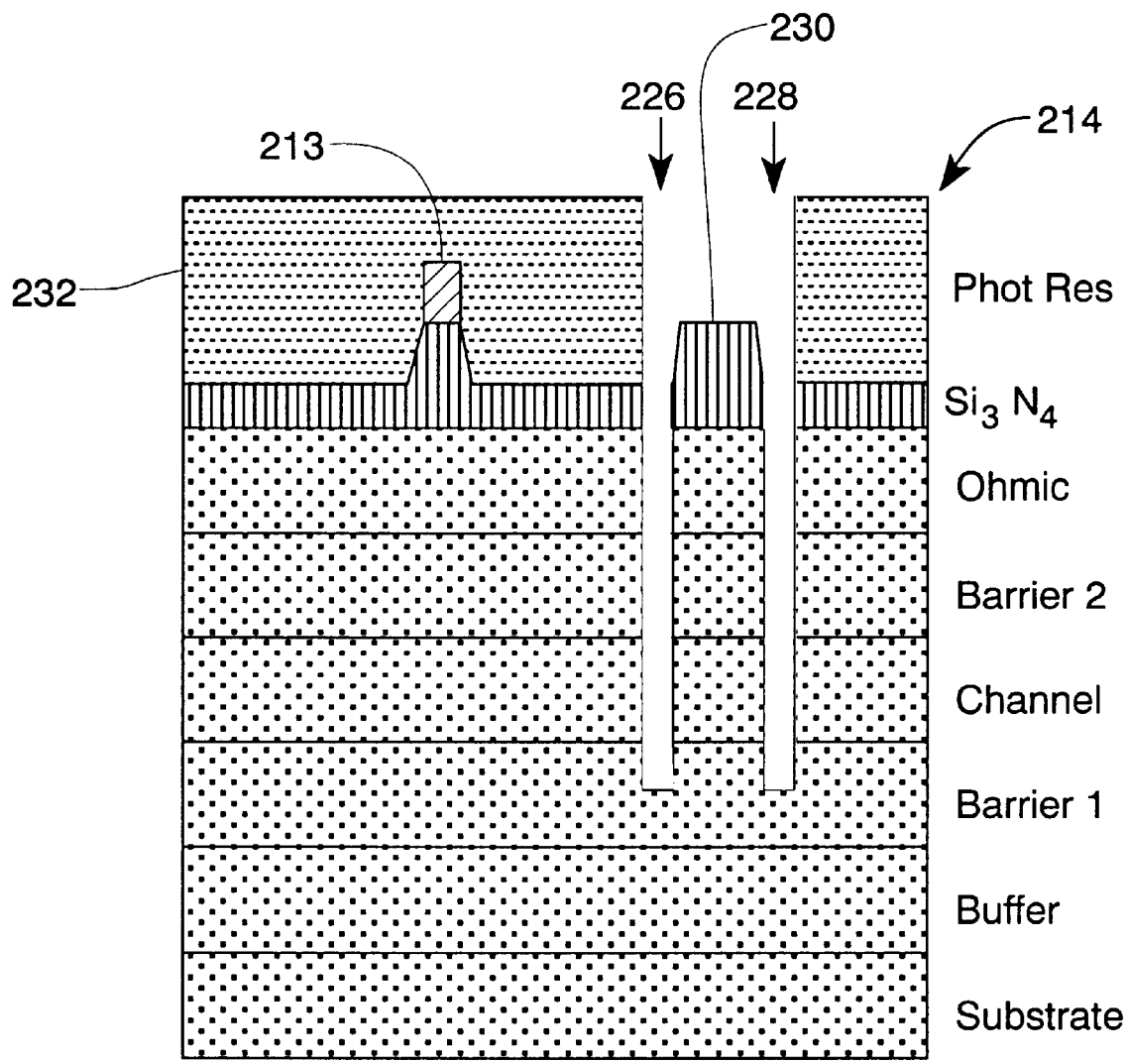
FIG. 2G shows the FIG. 2F structure after additional processing.
Figure 2H:
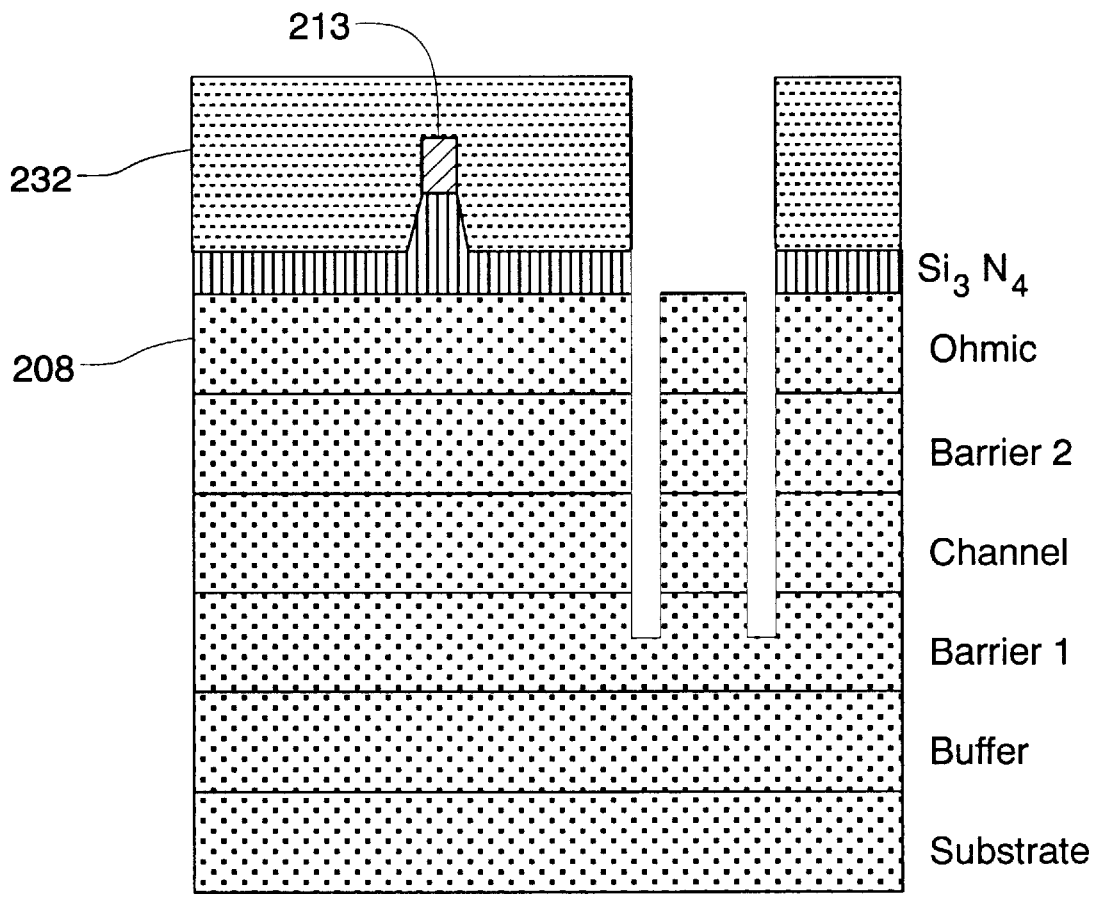
FIG. 2H shows the FIG. 2G structure after additional processing.
Figure 21:
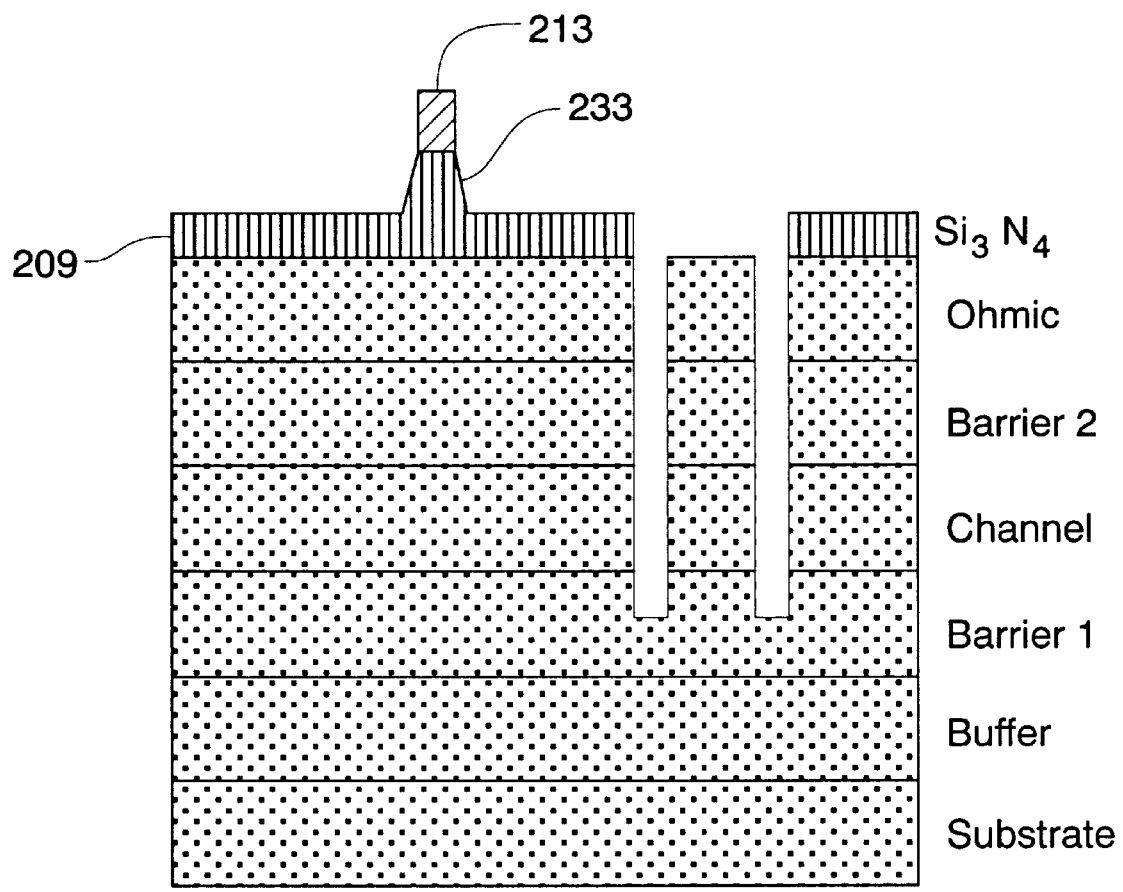

In the FIG. 2G step the semiconductor material surrounding the silicon nitride material mask element 230 is subjected to a boron trichloride reactive ion etch in the regions 226 and 228 where this semiconductor material is not protected by the silicon nitride material pattern of mask element 230. The thin column recesses thus formed through layers of the semiconductor material are parts of a cross-shaped alignment mark; a mark preferably made to be about one micron in depth, and serve as readily sensed edge marks for distance measuring equipment used in later wafer sequences. The boron trichloride reactive ion etch may be accomplished at a temperature of 300 degrees Kelvin and a pressure of 20 millitorr using a time of 60 minutes. In FIG. 2H of the FIG. 2 sequence removal of the silicon nitride mask element 230 down to the semiconductor material of the ohmic contact layer 208 is depicted. The FIG. 2H silicon nitride removal may be accomplished with a Freon® and oxygen reactive ion etch with a mixture of 45 sccm (standard cubic centimeters per minute) of Freon® and 2 sccm of oxygen (i.e., a 45/2 sccm mix) and a pressure of 40 millitorr using a temperature of 300 degrees Kelvin. This removal is deemed a continuation of the step four and mask level two sequence commenced in FIG. 2G.

Figure 2J:
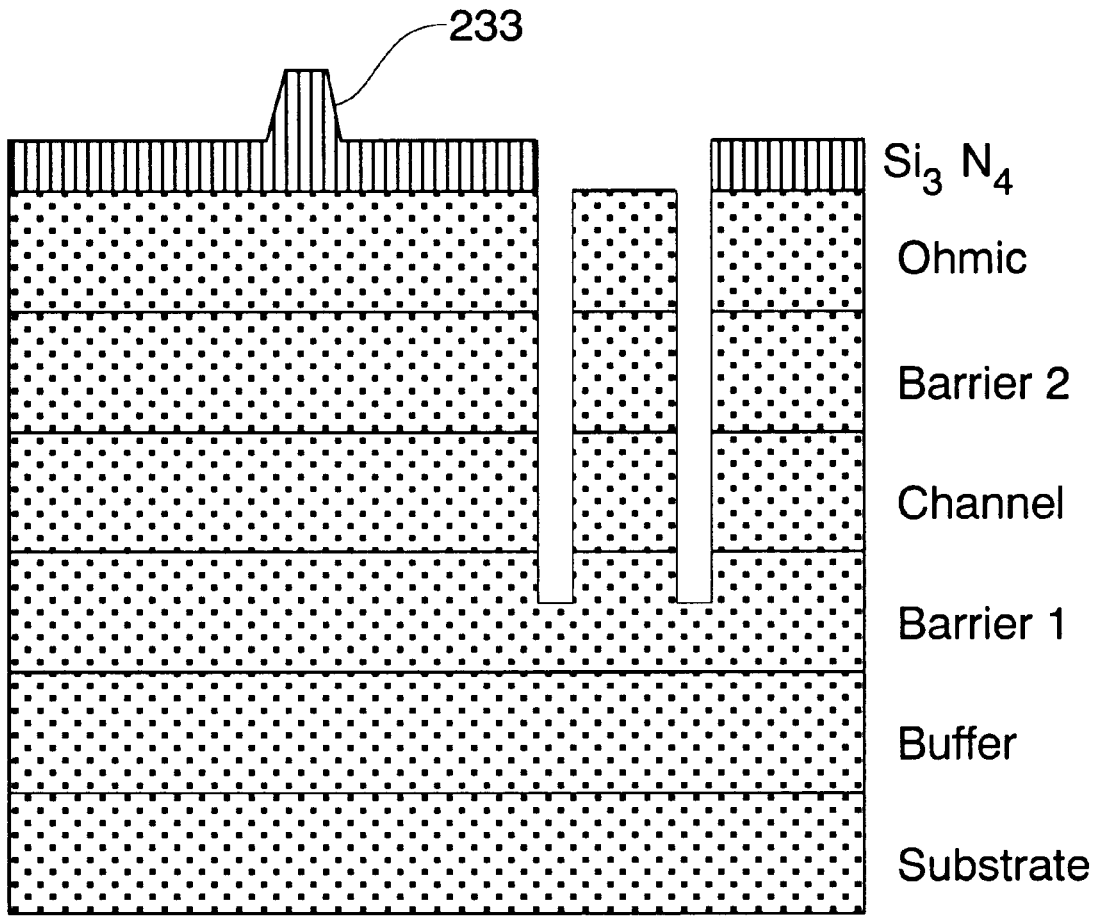
FIG. 2J shows the FIG. 2I structure after additional processing.

FIG. 2I shows removal of remaining portions of the photoresist material 232 covering the aluminum metal mask element 213 in preparation for their additional removal. The photoresist material 232 may be dissolved by conventional photoresist layer removing techniques employing, for example, an acetone soak at a pressure of 760 Torr using a temperature of 300 degrees Kelvin. This removal is deemed a continuation of the step four and mask level two sequence commenced in FIG. 2G. FIG. 2J represents an actual removal of the aluminum metal mask element 213 to leave the sloping sided silicon nitride material mask element 233. A sodium hydroxide etch with a one molar solution and a pressure of 760 Torr using a temperature of 300 degrees Kelvin may be used for the FIG. 2J step. This removal is also deemed a continuation of the step four and mask level two sequence commenced in FIG. 2G.

Figure 2K:
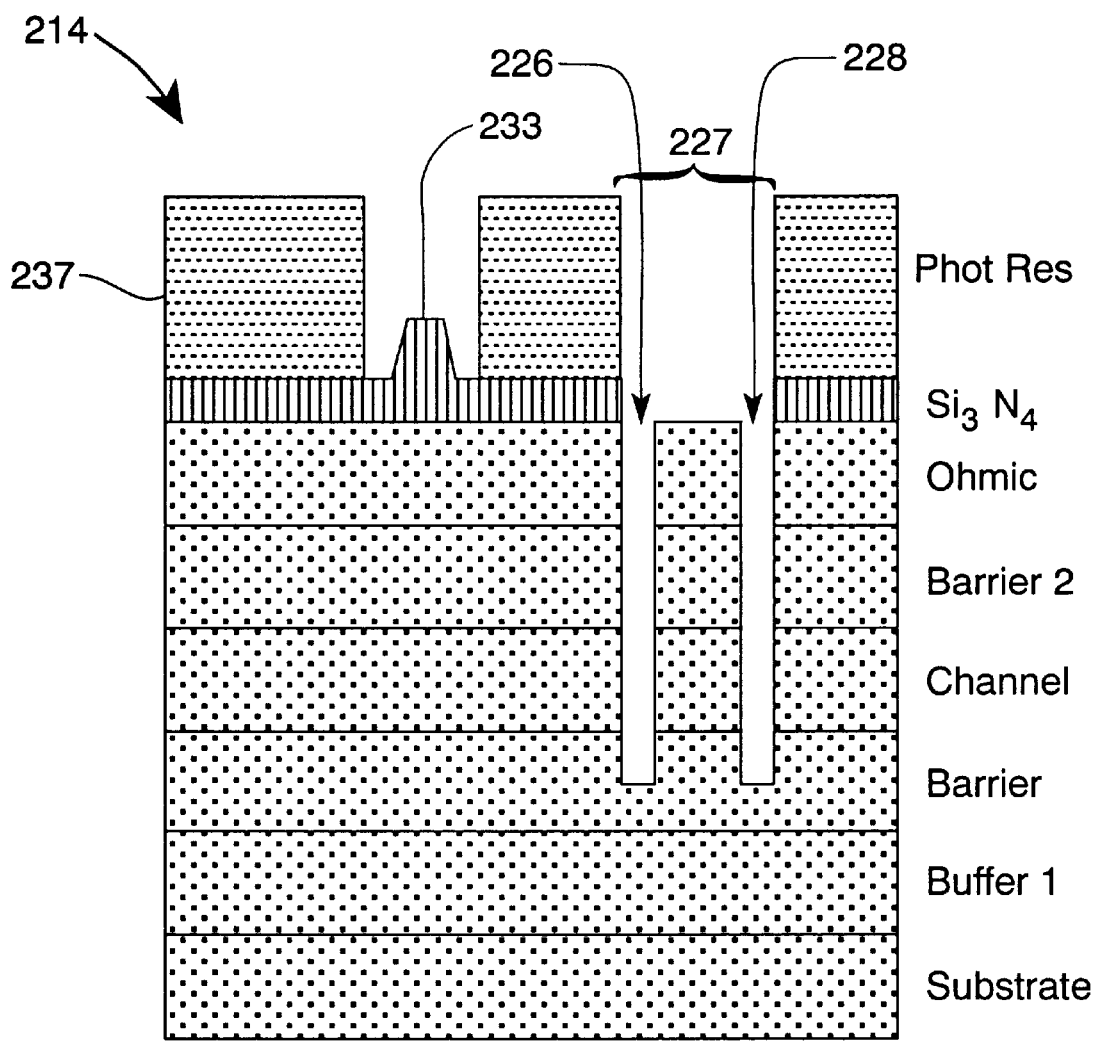
FIG. 2K shows the FIG. 2J structure after additional processing.

FIG. 2K in the drawings shows the formation of a new photoresist mask element 237 over parts of the wafer 214 excepting the silicon nitride material mask element 233 and the alignment marks 226 and 228 in alignment mark area 227. As with the other FIG. 2 photoresist masks, the mask element 237 is of course formed by a combination of photoresist spinning and lithographic exposing and developing. These steps (and similarly other steps in the FIG. 2 series) are abbreviated to the FIG. 2K step in the interest of limiting the size of the present document. As indicated in the FIG. 2K legend this photoresist 237 is in preparation for a semiconductor layer doping step by ion implantation. For protecting wafer parts not to be exposed to this ion implantation a layer of 1813 photoresist of one and three tenths micrometer (i.e., micron) thickness is found to be satisfactory at 237. The FIG. 2K operations represent a fourth step and a third mask level in the FIG. 2 sequence as indicated in the legend. A significant additional use of the silicon nitride material by way of mask element 233 is notable in the FIG. 2M step. From an element registration perspective it may be helpful to recall that this FIG. 2K step, in preparation for a subsequent exposure of p-channel or n-channel transistor elements, is defined in geometry by the aluminum metal mask element 213 in FIG. 2D and the FIG. 2B mask of photoresist 216 originally used for its formation.

Figure 2L:
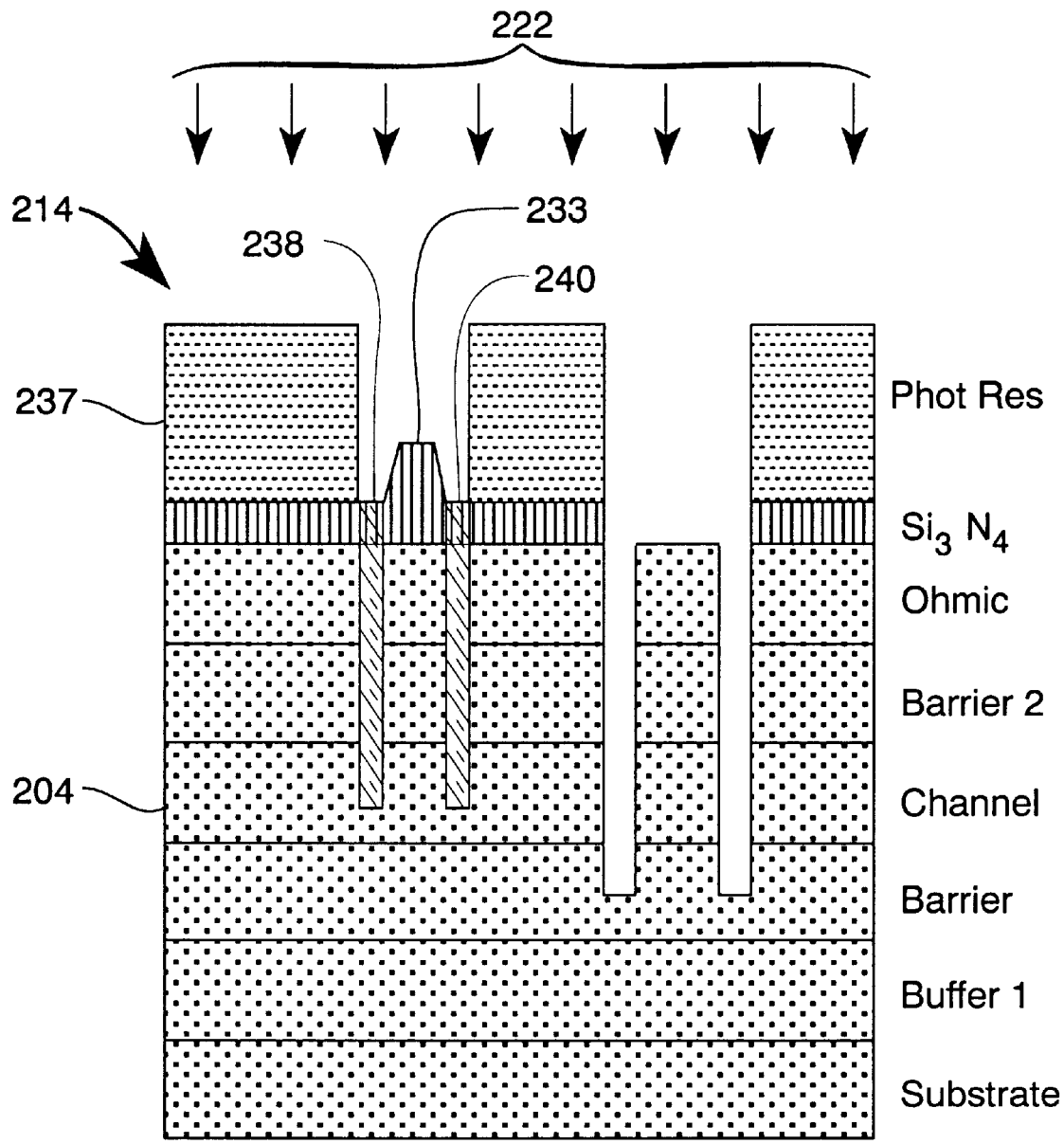
FIG. 2L shows the FIG. 2K structure after additional processing.

FIG. 2L indicates the ion implantation operation has been accomplished in the vertically or orthogonally disposed wafer semiconductor regions on opposed sides of the sloping silicon nitride mask element 233. This implantation occurs in the spaces identified at 238 and 240 in the drawing through the 50 micrometer window of the photoresist mask 237. Ion implantation of silicon N-type ions for an n-channel transistor may use an energy level of 75 to 100 thousand electron volts and a silicon dose of two to four times ten to the fourteenth power ions per square centimeter. Ion implantation of Beryllium P-type ions using an energy level of 35 to 50 thousand electron volts with a Beryllium dose of three to five times ten to the fourteenth power ions per square centimeter may be used for a p-channel transistor.

In this FIG. 2L implant operation the sloping sides of the silicon nitride mask element 233 provide a means by which the achieved doping in the semiconductor material layers (i.e., doping in the implanted vertically aligned or layer registered layer region at 238 or 240) is of a desirably diffused rather than sharp horizontal boundary character. The ion implanted vertically aligned layer regions at 238 and 240 comprise vertically disposed conductive paths by which external current flow communicates through the uppermost semiconductor layers of the wafer 214 to reach the channel layer-level source and drain elements of the FIG. 2L transistor.

The FIG. 2L formed vertical conductors, i.e., the ion implanted conductive regions at 238 and 240 preferably extend well into the channel layer, an extension of some one hundred angstroms into a channel layer of one hundred twenty five angstroms thickness being a suitable arrangement. The ion implantation of the FIG. 2L step may also be viewed as having formed the source and drain elements of the transistor—within the channel layer 204. During implantation of the aligned layer regions at 238 and 240, the silicon nitride mask element 233 serves a yet additional function of achieving a region of maximum ion concentration in the implant near the upper surface of the ohmic contact layer 208. Such a concentration provides desirably low electrical resistance between the ion implant-doped semiconductor material and an overlaying metal contact pad. Use of the silicon nitride material of the mask element 233 to accomplish this source and drain element and source and drain element conductive path ion implant service is deemed a fifth use of the silicon nitride layer of material in the present invention.

Performance of the FIG. 2L ion implant step is represented at 222 in the drawing. Accomplishing this step through the thickness of the silicon nitride material layer 209 in the regions 238 and 240 has of course accomplished an ion implant doping of the silicon nitride material itself in these regions. This silicon nitride material implantation is represented in the FIG. 2L drawing by showing an overlapping of the shading used to represent ion implantation in the semiconductor material with the shading used to represent the silicon nitride material in the regions 238 and 240. Similar representations are used for other ion implant operations performed in the FIG. 2 sequence. This ion implantation of the silicon nitride material in what is considered the "secondary mask" areas of the layer 209 does not preclude later use of these areas as is described below. This ion implantation may make later removal of the secondary mask elements somewhat more difficult; however, satisfactory removal is found possible as is also described below.

Figure 2M:
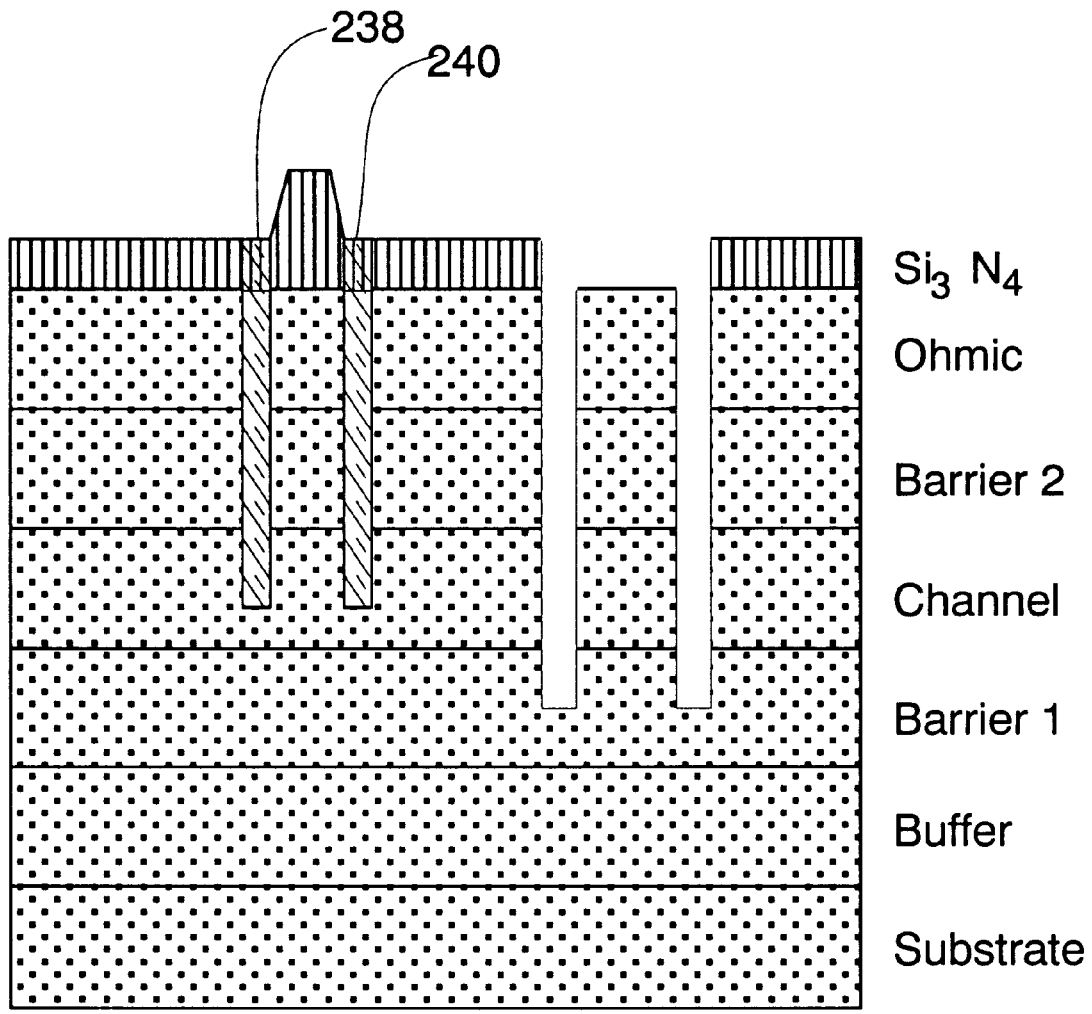
FIG. 2M shows the FIG. 2L structure after additional processing.

FIG. 2M in the drawings indicates the accomplishment of a step six in the fabrication sequence, a removal of the photoresist layer 237 and an activation of the ion-implanted dopant materials from the FIG. 2L step by way of a rapid thermal annealing sequence. As indicated in the legend, an anneal of ten seconds duration and 750 to 800 degrees centigrade temperature is found satisfactory for this purpose. This activation step has the effect of enabling dispersion of the ion-induced dopant materials into the crystal lattice of the vertical conductors at 238 and 240 and into the source and drain regions of the transistor such that normal doped semiconductor material electrical characteristics are obtained. During the FIG. 2M thermal anneal step the remaining silicon nitride material of the secondary mask layer 209 serves yet another useful function in diffusing the thermal energy of the brief anneal step to an appropriate degree. This thermal diffusion is believed to improve the electrical conductivity characteristics of the ohmic contacts achieved in the transistor.

Parenthetically speaking it may be noted at this point in the FIG. 2 sequence that use of the FIG. 2L different ion implants, and the associated FIG. 2M thermal anneal step, comprise the present invention tools by which layers of undoped semiconductor material are called into the two different charged carrier conduction modes (p-channel holes and n-channel electrons) required in the two types of field-effect transistor. That is, the same semiconductor material (primarily in the channel layer 204) is caused to perform in the p-channel or hole carrier conduction mode and in the n-channel or electron carrier conduction mode by way of the ion implant dopings of semiconductor material in the FIG. 2L step. Electrical conduction in the same modes is also provided in the ion implanted layers of the vertical conductor stock at 238 and 240 through the action of these implant and anneal tools.

Figure 2N:
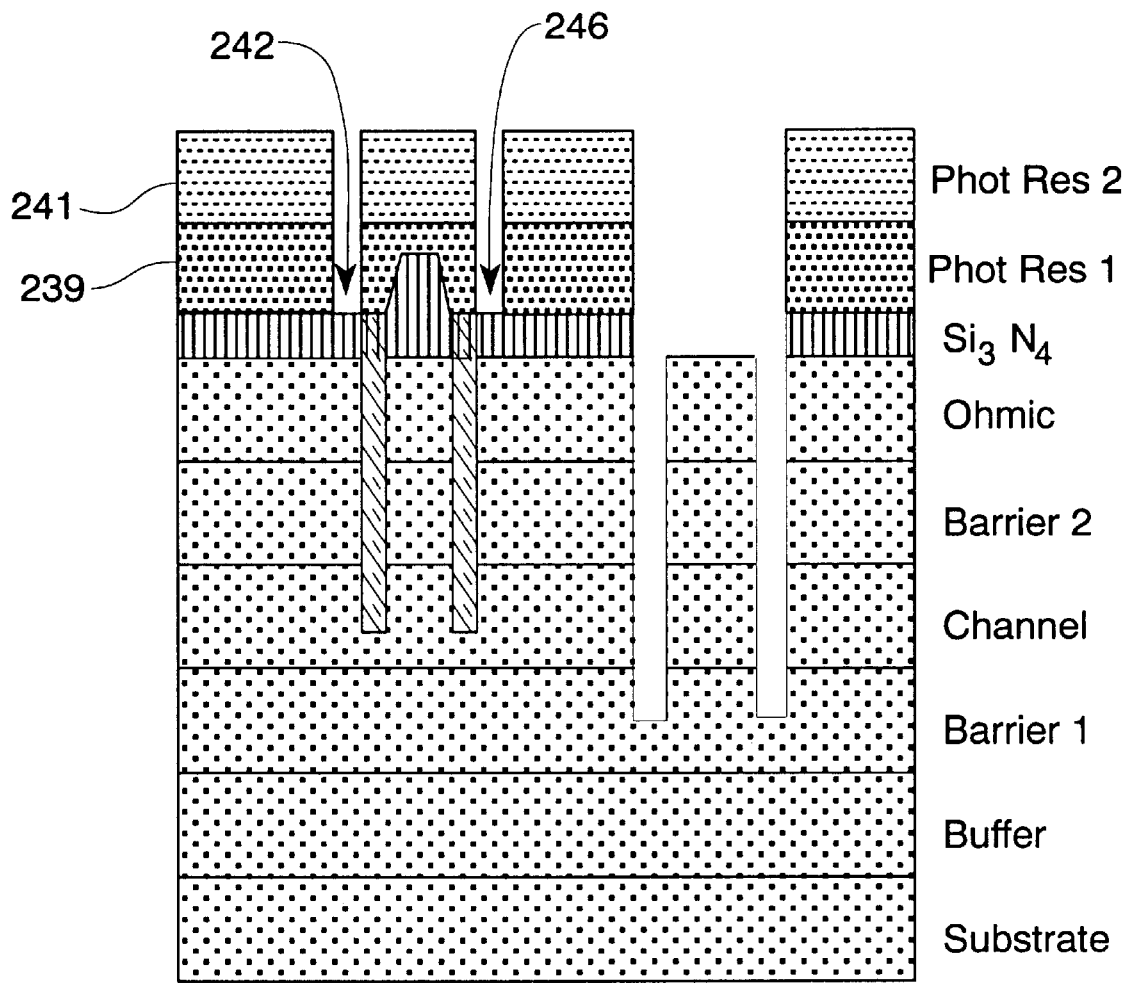
FIG. 2N shows the FIG. 2M structure after additional processing.
Figure 20:
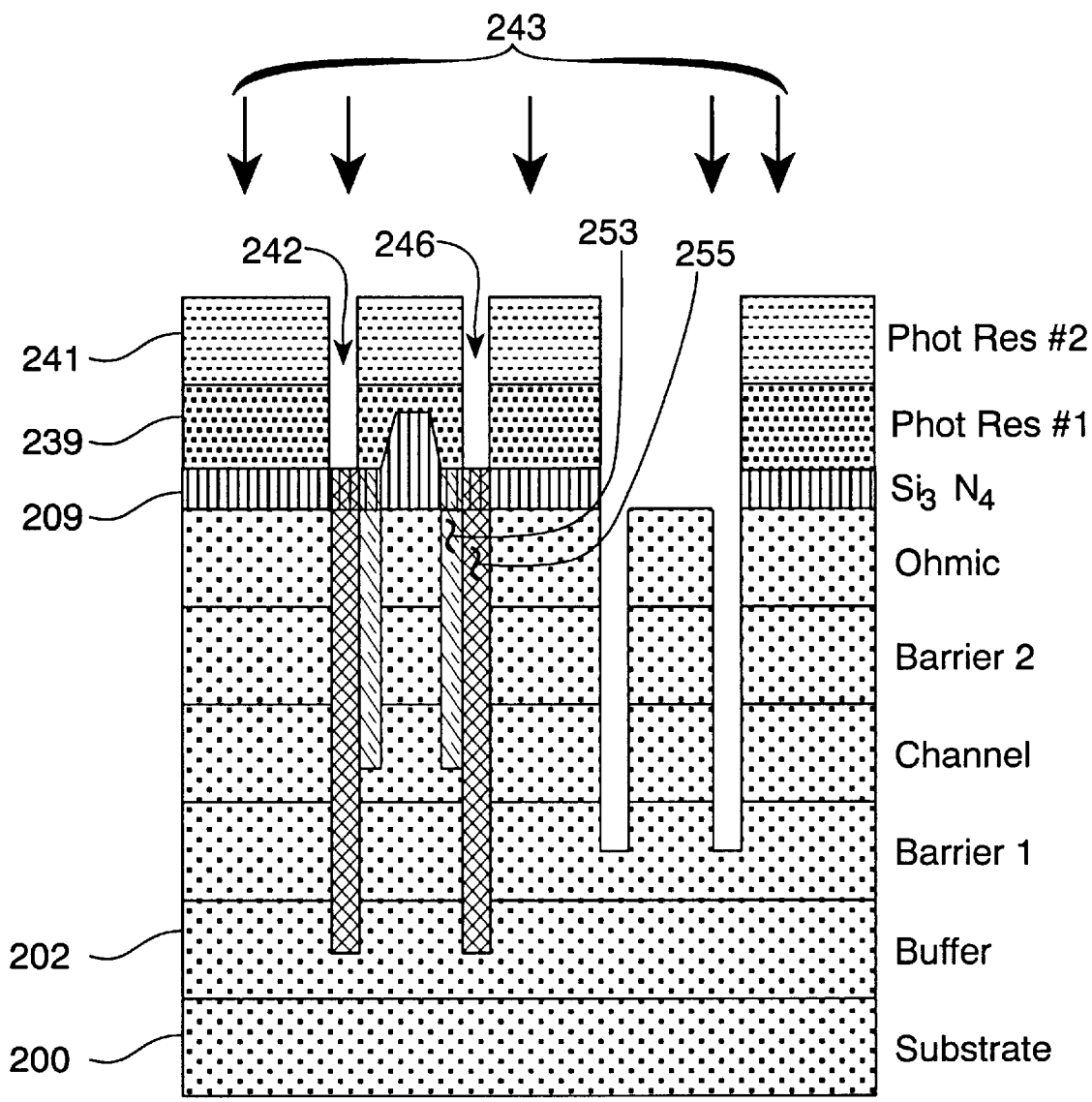

FIG. 2N in the drawings represents the accomplishment of mask level four, step seven processing on the transistor. In this drawing the pattern of the level four mask has been used to dispose two layers of protective photoresist material over the silicon nitride material in each of the now dopant ion implanted source and drain vertical conductor regions 238–240. This is in preparation for accomplishing a conductivity spoiling oxygen ion implant operation to electrically isolate the transistor being fabricated. These electrical isolation portions include the regions 242 and 246 between the transistor and other transistors which may be formed in the wafer. Such isolation may also involve other electrical components of the wafer or the bulk semiconductor material of the wafer.

The ion implantation for isolation of adjacent transistors on a wafer as contemplated in FIG. 2N and accomplished in FIG. 2O, may be used to achieve adjacent transistor isolation in the layers below the silicon nitride material layer 209. Such implanting, with oxygen ions for example, is indicated at 243 in FIG. 2O and is preferably accomplished through use of the single dual layer mask represented at 239 and 241 in FIGS. 2N and 2O in order to avoid a tedious and error prone mask realignment step. FIGS. 2N and 2O in the drawings therefore show the addition of the lithographically configured dual layer photoresist mask over the silicon nitride material layer 209. This dual layer mask at 239 and 241 may have a 1.1 micron thick lower "Phot Res #1" layer of PMGI photoresist material and a 1.3 micron thick upper "Phot Res #2" layer of 1813 photoresist material. These materials are available from Micrographic Chemical Corporation (MCC) and Shipley Corporation of Newton, Mass. and Marlborough, Mass. respectively. The multiple-layered isolation regions achieved by ion implantation are indicated at 242 and 246 in FIG. 2O.

As recited in the FIG. 2O legend, a four-step oxygen ion ($O_2$) implant sequence is applied to the photoresist-masked wafer of FIG. 2N to accomplish the desired electrical isolation. This step preferably uses the successively decreasing energy levels of three hundred, one hundred ninety, ninety and thirty five thousand electron volts; and the respectively successively smaller dose rates of one times ten to the twelfth power, six times ten to the eleventh power, four times ten to the eleventh power and one and one-half times ten to the eleventh power ions per square centimeter, as recited in the FIG. 2O legend; this in order to obtain a reasonably flat profile of oxygen ion concentrations through the depth of the implanted wafer areas. The accomplished isolation implants in the unmasked areas of FIG. 2O are desirably extended into the buffer layer 202 as shown or even more desirably down to the substrate 200. The oxygen ion implantation of layer 209 silicon nitride material is indicated by the cross hatch pattern discussed above in FIG. 2O and in the later FIG. 2 drawings.

In a three-dimensional view the implant regions achieved at 242, 244 and 246 could, as indicated above, appear for example as transistor-enclosing geometric patterns (such as squares) spread across the wafer 214 to provide the desired complete electrical isolation for each transistor. Typical representations of a third dimensional view of the implant regions at 242, 244 and 246 appear in the FIG. 3 and FIG. 4 drawings herein. Specific details of the FIG. 2O implant process are somewhat equipment dependent; however, a pressure of one times ten to the minus six Torr using a flow of three to five pounds per square inch and a temperature of 300 degrees Kelvin may generally be used. The two photoresist layers, layers 239 and 241 in FIG. 2N and FIG. 2O, provide the degree of ion imperviousness needed for the relatively heavy implant of the FIG. 2O step—i.e., the imperviousness needed to preclude penetration through a normal single layer of photoresist by this implant.

Figure 2P:
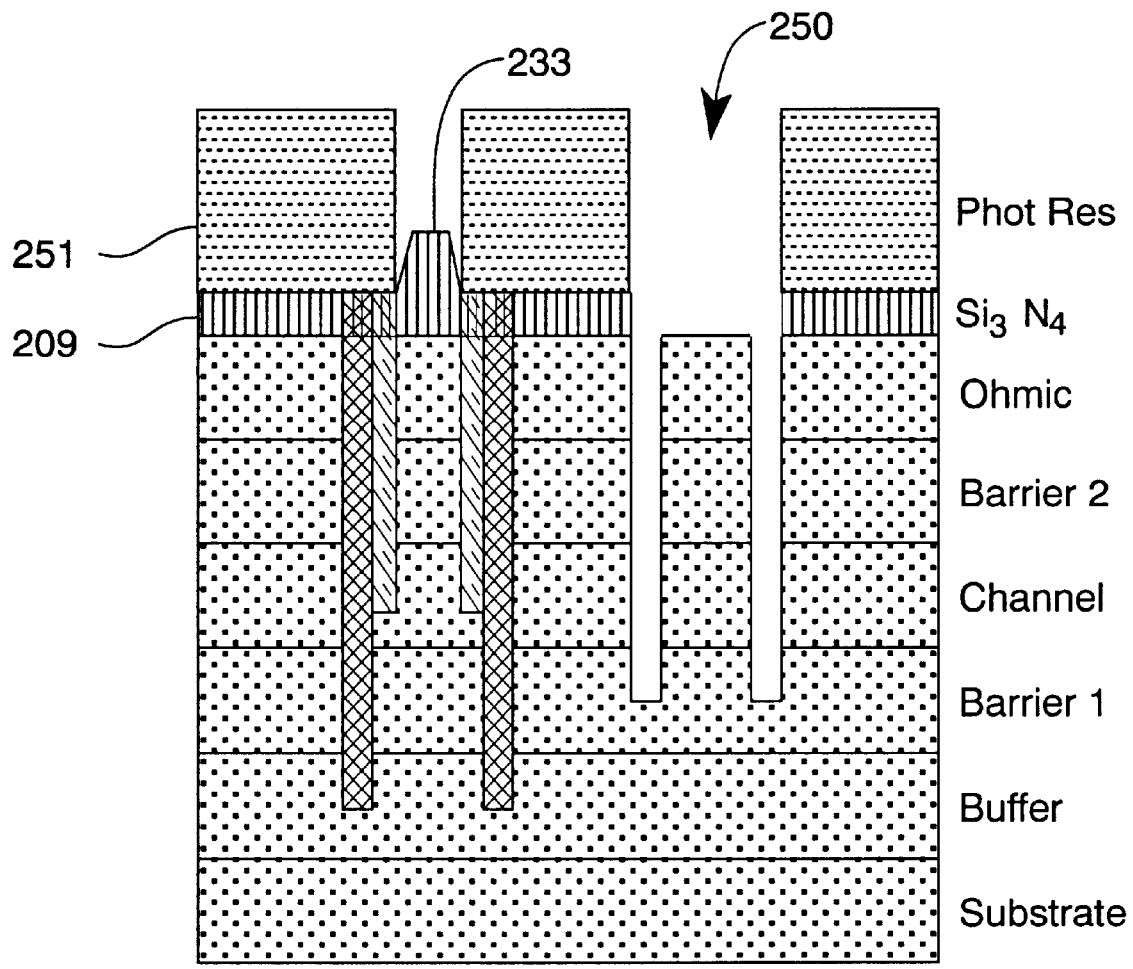
FIG. 2P shows the FIG. 2O structure after additional processing.

A removal of the dual layer photoresist patterns of the FIG. 2O step to once again expose the silicon nitride material mask element 233 is represented in the FIG. 2P drawing. In view of the two layers of photoresist being removed in this step a removal sequence involving first an acetone dissolution of the 1813 photoresist via soaking and then removal of the PMGI photoresist with a MCC 1165 solution (of basic pH range) which has been heated to ninety degrees centigrade may be employed. FIG. 2P also shows the addition of a new layer 251 of photoresist, a new layer of the heretofore used 1813 resist, to all except the gate-related and alignment mark areas of the transistor. This step involves use of a mask level 5 in a step 8 of the FIG. 2 sequence as indicated in the FIG. 2P legend and subsequently results in the gate region and alignment mark photoresist-free regions indicated at 250 and 252 in the FIG. 2Q drawing.

Figure 2Q:
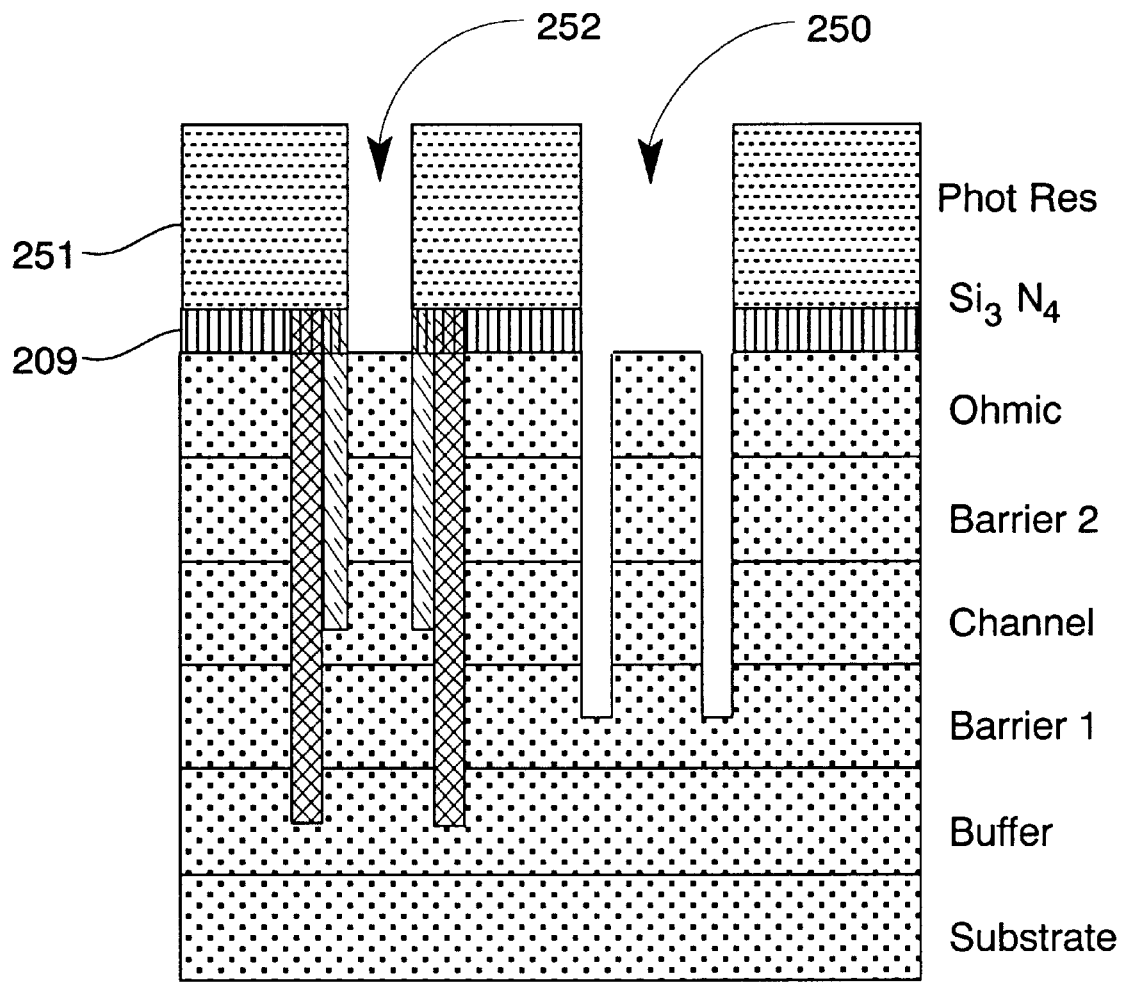
FIG. 2Q shows the FIG. 2P structure after additional processing.

Removal of the FIG. 2P silicon nitride material mask element 233 and the integral underlying portions of the silicon nitride material layer 209/210, a layer which has been in position since step one in FIG. 2A of the fabrication sequence, is accomplished in the step of FIG. 2Q in the drawings. This second step 8, mask level 5, removal of the silicon nitride material opens the gate-related regions 252 of the transistor and also the alignment mark area 250 for processing. The FIG. 2Q silicon nitride material removal step may be accomplished with another Freon® and oxygen reactive ion etching sequence (using the above described 45/2 sccm mix) as indicated in the FIG. 2Q legend. A pressure of 40 millitorr and a temperature of 300 degrees Kelvin may be used for the FIG. 2Q reactive ion etch.

Figure 2R:
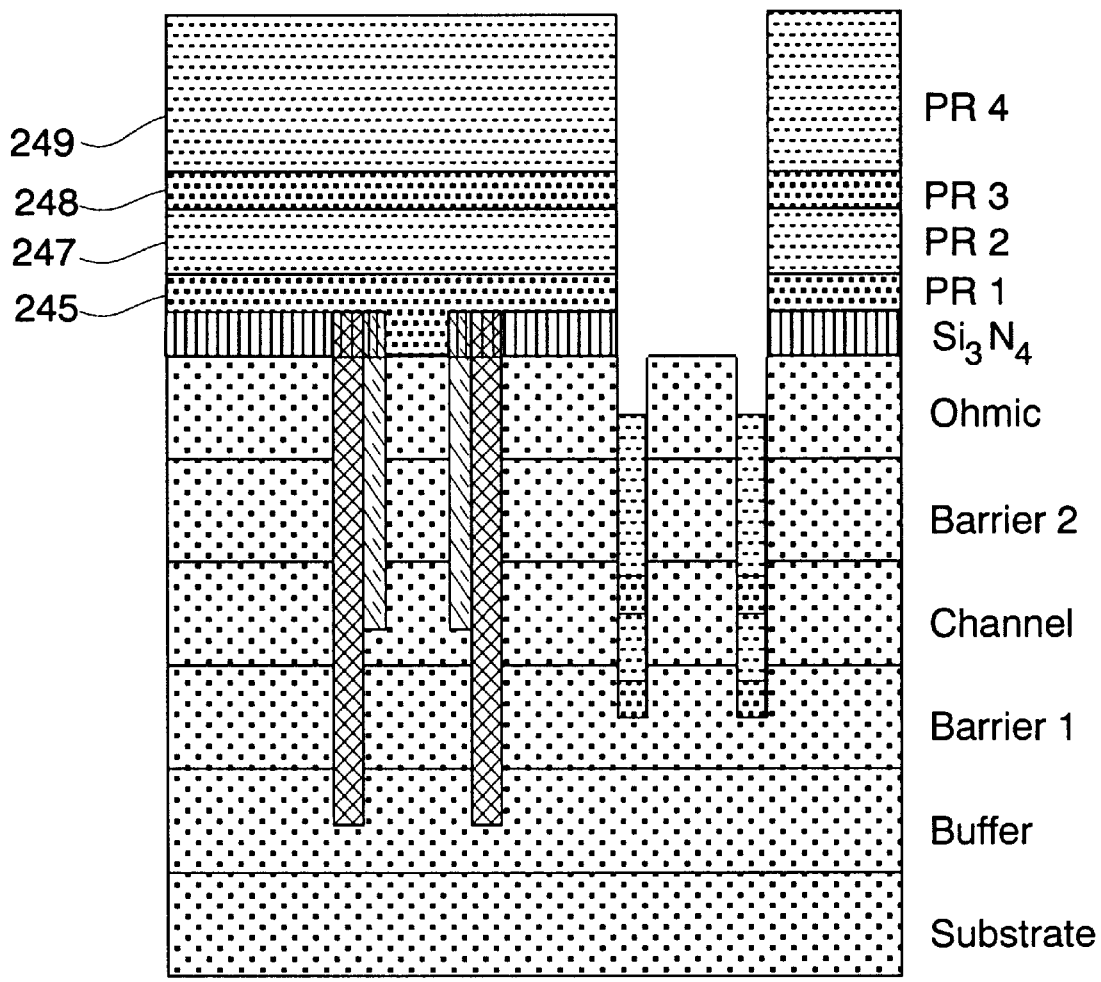
FIG. 2R shows the FIG. 2Q structure after additional processing.

FIG. 2R in the drawings commences a series of steps arranged to accomplish the fabrication of a narrow or thin gate stripe conductor and other fine details of the transistor—including determining stripe location. In the present transistor a gate stripe "length", a length measured along the charged carrier flow direction, of four tenths micron in its mushroom stem area is being sought. The mushroom head of the desired gate measures about 1 micron. The present inventors prefer to accomplish the FIG. 2R and ensuing processing steps using a combination of optical and electron beam lithography steps, i.e., using the Electron Beam Optical Lithography (EBOL) sequence, described in certain previous patent documents and in certain published literature articles. Specifically these descriptions appear in the above identified Sewell and Bozada publication reference identified as number 22, in the 22 items list and in the identified prior filed patent documents and in publications identified in these prior filed patent documents. Generally the EBOL process uses optical photolithography to define mask elements for relatively large features in the transistor, features which can be effectively formed using optical ultraviolet exposures to form masks for lithographic purposes, and then employs the slower but more precise electron beam exposure for small features in the transistor gate area. The slower but more accurate and high resolution electron beam lithography is considered viable, for example for features between 0.4 micron down to 0.05 micron in size. The EBOL process therefore combines optical photolithography and electron beam lithography into an optimized unified optical/electron beam sequence.

Therefore after removal of the FIG. 2P and FIG. 2Q photoresist layer 251, the FIG. 2R EBOL sequence commences with a deposition of four photoresist layers, layers 245, 247, 248, and 249 on the cleared and silicon nitride material recess-containing wafer deriving from the FIG. 2Q step. These FIG. 2R photoresist layers may be comprised of PMMA A5.5, PMMA E9, PMMA A5.5 and 1813 photoresist materials respectively in a bottom to top sequence. These different photoresist layers are identified with different shadings in the FIG. 2T drawing; the shading for the two PMMA A5.5 layers being the same and the shading for the uppermost 1813 material layer being the same as used for this material in the previous drawings of the FIG. 2 sequence. The FIG. 2R layers are shown somewhat to relative thickness size. In the four layers 245, 247, 248, and 249 the upper layer 249 preferably has a thickness dimension of 1.3 micron and the lower three layers, layers 245, 247 and 248 have a total thickness of 1.1 micron with the center layer, layer 247 being twice the thickness of either of the layers 245 and 248. In other words the layers 245, 247 and 248 have respective thickness dimensions near 0.20, 0.55 and 0.27 microns each. The PMMA E9 material of the center 247 layer is preferably deposited with a double spinning operation in view of its greater thickness.

The FIG. 2R photoresist layers may for specific example be accomplished by flooding the two to three inch, circular shaped, layered semiconductor wafer with PMMA 495K A5.5 photoresist using a spin speed of five thousand revolutions per minute for sixty seconds accompanied by a two hundred degree centigrade hotplate bake for one minute to form the layer 245. This is followed by flooding the now once-coated wafer with MMA(8.5)MAA E9 photoresist using a spin speed of three thousand revolutions per minute for sixty seconds accompanied by a two hundred degree centigrade hotplate bake for one minute to form the first half of layer 247. This is followed by flooding the now twice-coated wafer with more MMA(8.5)MAA E9 photoresist using a spin speed of three thousand revolutions per minute for sixty seconds accompanied by a two hundred degree centigrade hotplate bake for one minute to form the second half of layer 247.

This is followed by flooding the now three times-coated wafer with more PMMA 495K A5.5 photoresist using a spin speed of three thousand revolutions per minute for sixty seconds accompanied by a two hundred degree centigrade hotplate bake for five minutes to form the layer 248. This is finally followed by flooding the now four times-coated wafer with 1813 photoresist using a spin speed of four thousand revolutions per minute for thirty seconds accompanied by a one hundred ten degree centigrade hotplate bake for seventy five seconds to form the layer 249. After use of this sequence the above quoted photoresist layer thickness dimensions appear in slightly modified form as layers of respective thickness of two thousand, two thousand seven hundred, two thousand seven hundred, two thousand four hundred and thirteen thousand angstroms thickness respectively.

In the FIG. 2R photoresist layers, the lowermost three layers, layers 245, 247 and 248 are used in the electron beam exposure sequence. The fourth photoresist layer, the uppermost layer 249 is used for the optical exposure sequence in the EBOL process. This somewhat elaborate procedure provides one arrangement for fabricating a precision mushroom gate structure of small size, precise location, low parasitic inductance and low gate resistance as is desirable in high frequency-capable (microwave-capable) transistors made in accordance with the invention. Other photoresist arrangements for forming a mushroom gate structure including arrangements requiring fewer layers of photoresist material are believed possible however the arrangement disclosed here has been found compatible with available apparatus. The low electrical inductance and low gate resistance characteristics of a mushroom gate structure are again particularly desirable in transistors intended for use in microwave, millimeter wave and other high frequency applications.

A consideration in using the three photoresist layers 245, 247 and 248 involves need for photoresist materials of differing exposure sensitivity in order to define the mushroom gate structure by way of a photoresist dosing modulation arrangement; another consideration involves accomplishment of a metal lift-off-enabling lip or overhang or cliff region in the upper photoresist layer at a later time in the sequence. The fourth photoresist layer 249 in the FIG. 2R step has previously been composed of type 1400-27 photoresist in some uses of the EBOL process however this material may be replaced with the 1813 photoresist used previously herein. The PMMA photoresist materials are available from MCC of Newton, Mass.

Figure 2S:
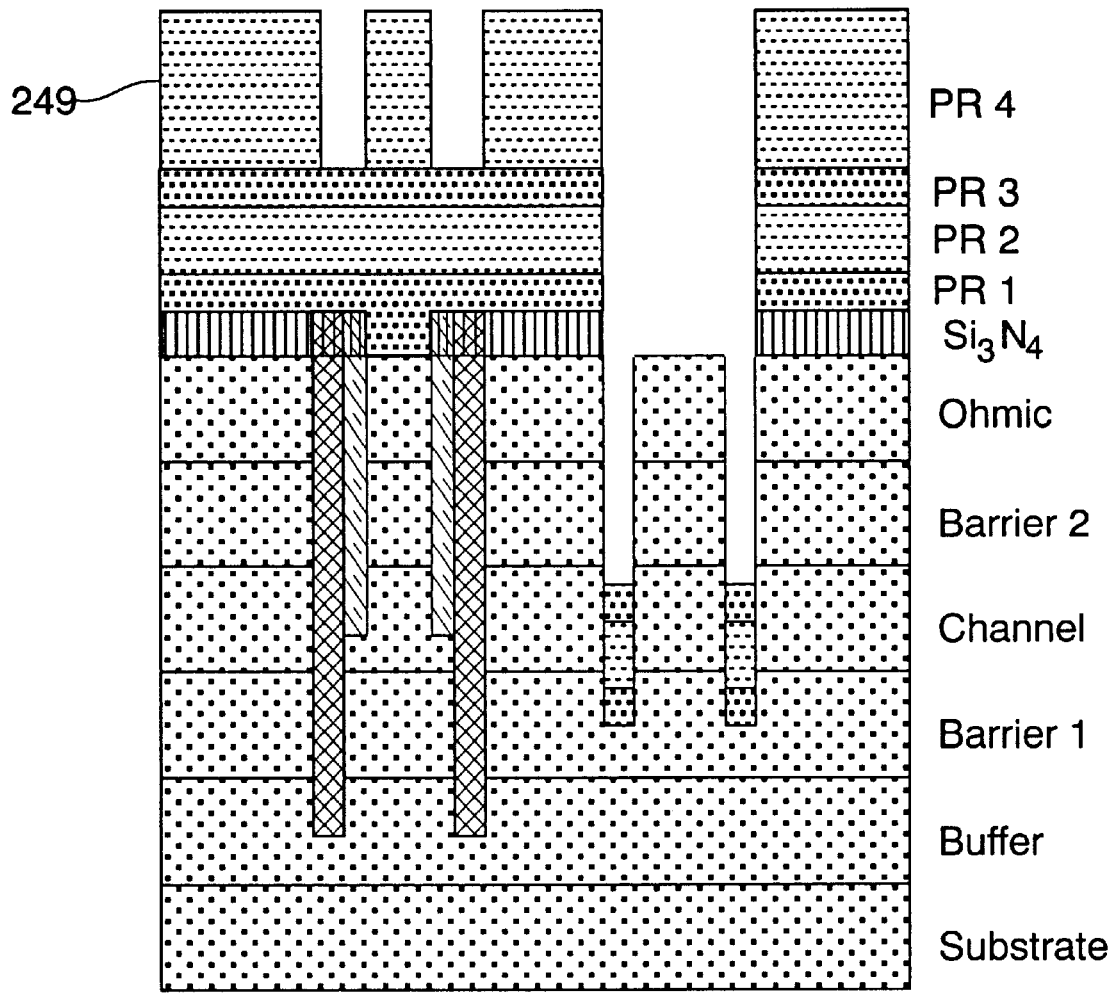
FIG. 2S shows the FIG. 2R structure after additional processing.
Figure 2T:
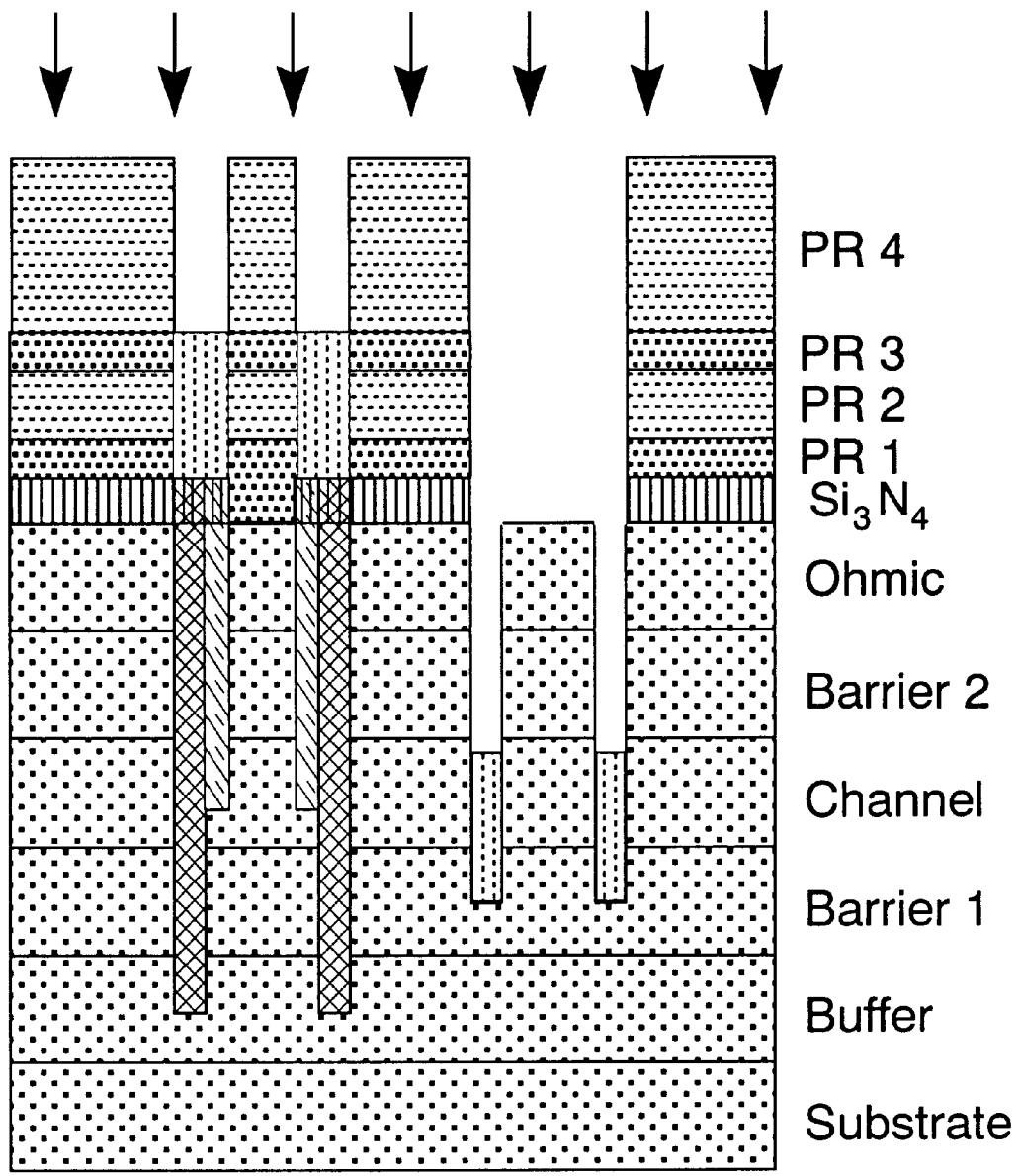
FIG. 2T shows the FIG. 2S structure after additional processing.

After the FIG. 2R photoresist layers are in place an exposure, performed with an optical aligner apparatus and using a near ultraviolet wavelength of 420 nanometers, may be used to define a mask in the uppermost photoresist layer 249. This mask is used to expose the photoresist material of the lower layers of the FIG. 2R stack, the layers 245, 247 and 248 with a deep ultraviolet energy source to obtain resolutions better than obtained with visible light and to take advantage of the spectral responses of the photoresist materials in the layers 245, 247 and 248. Large feature portions of the FIG. 2R transistors, i.e., source, drain and gate pad members are therefore defined optically in the layer 249 in order that their exposure is accomplished "in parallel" and thereby as rapidly as possible. After patterning the layer 249 material as a result of such near ultraviolet wavelength optical exposure, a pattern as shown in FIG. 2S is obtained. The deep ultraviolet energy (e.g., a wavelength of 220 to 250 nanometers) exposure of photoresist layers 245, 247 and 248 using this FIG. 2S pattern is represented in FIG. 2T where the exposed photoresist is represented with a vertical dotted line shading pattern. Development and removal of the FIG. 2T illustrated exposed photoresist material of layer 249 is represented in FIG. 2U.

Figure 2U:
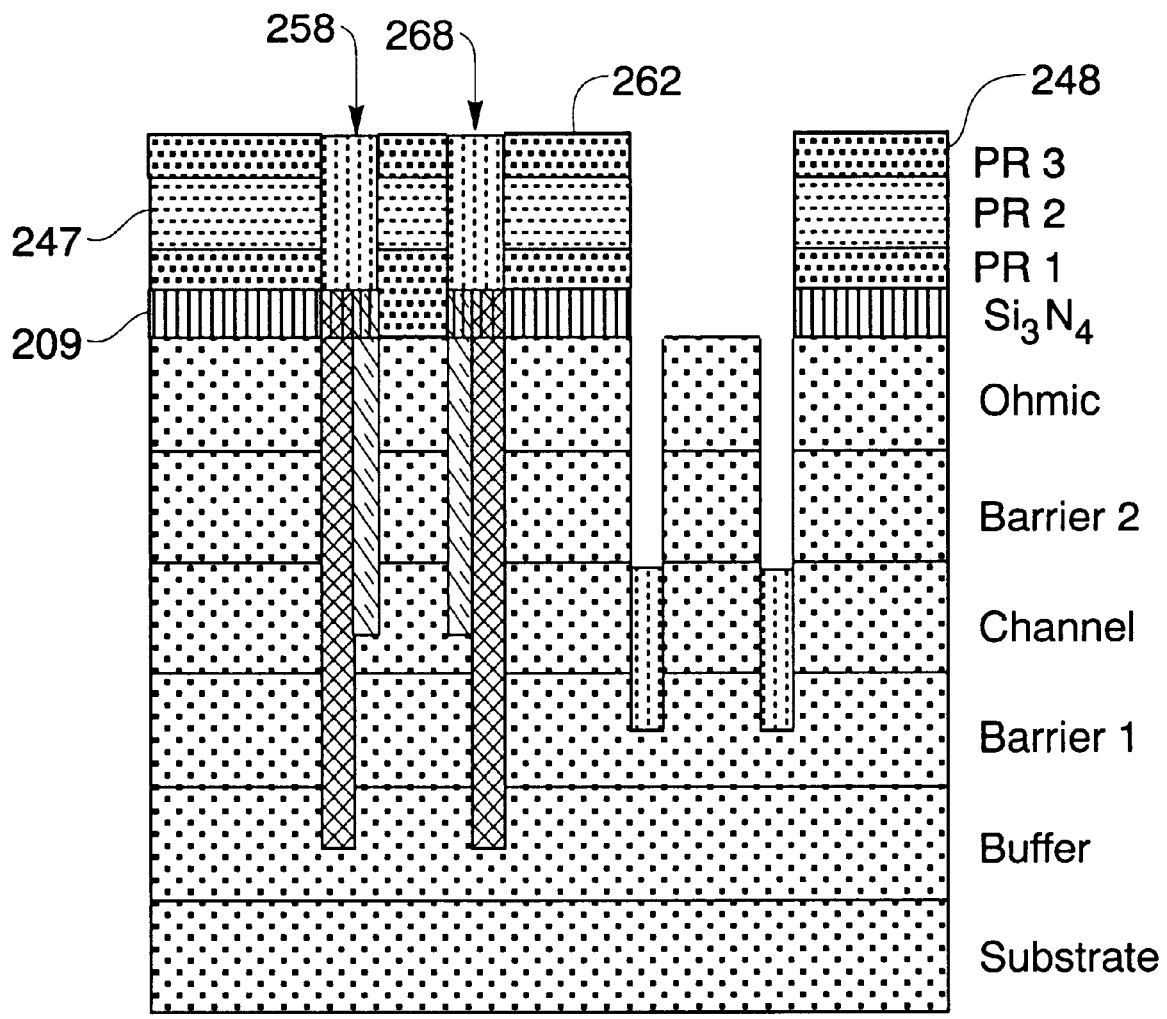
FIG. 2U shows the FIG. 2T structure after additional processing.

In the FIG. 2U operation the overlying upper photoresist layer 249 is removed while the exposed portions of the underlying three layers, 245, 247 and 248, are desirably allowed to remain in position. During the FIG. 2U event the exposed photoresist of the source and drain apertures 258/260 may however also be acted upon by the employed acetone solvent spray. In fact unexposed portions of the layer 248 material may also be removed during the FIG. 2U step. Exposed photoresist removal down to the junction of layers 248 and 247, for example, is believed to sometimes occur.

Figure 2V:
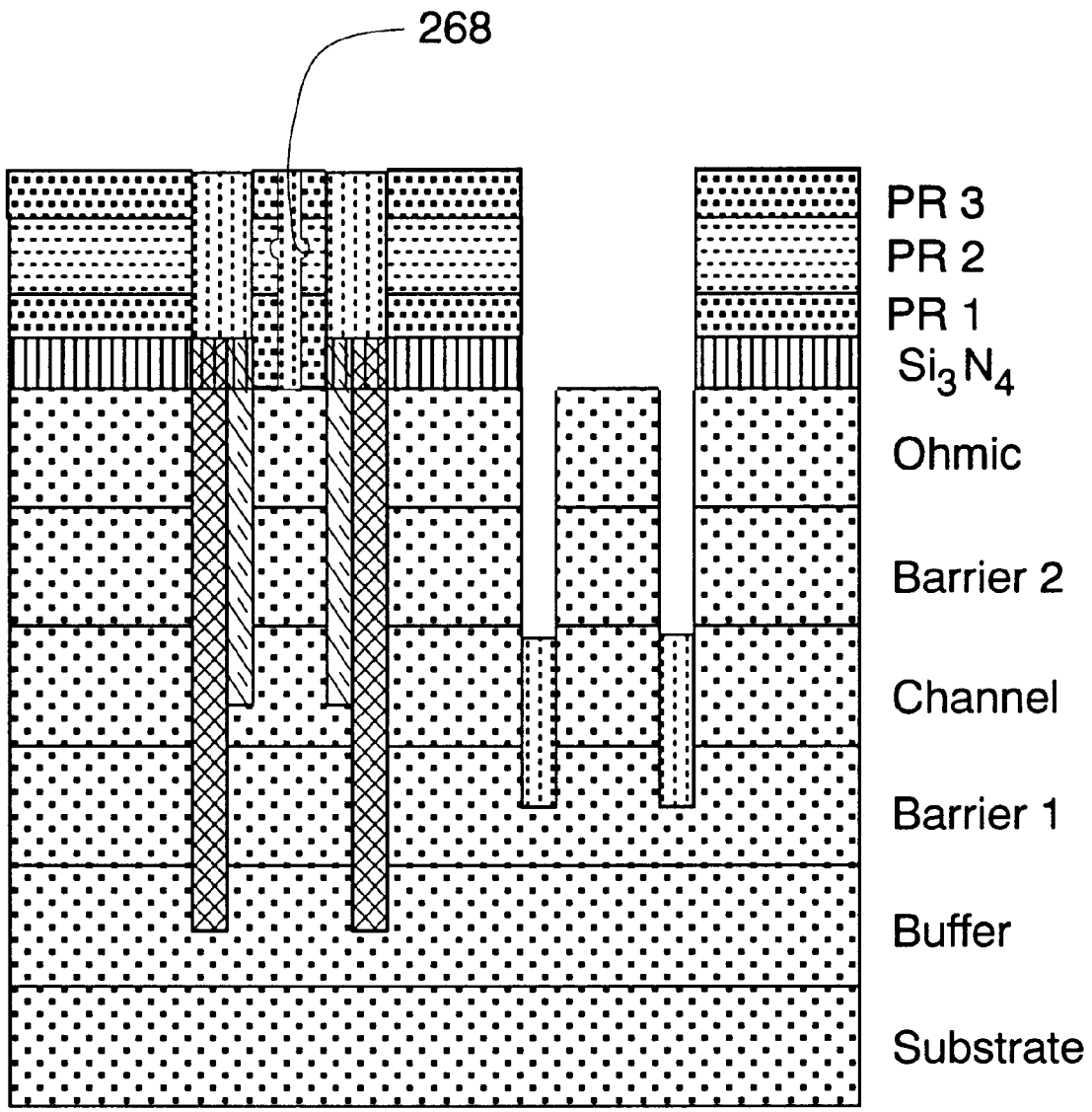
FIG. 2V shows the FIG. 2U structure after additional processing.
Figure 2W:
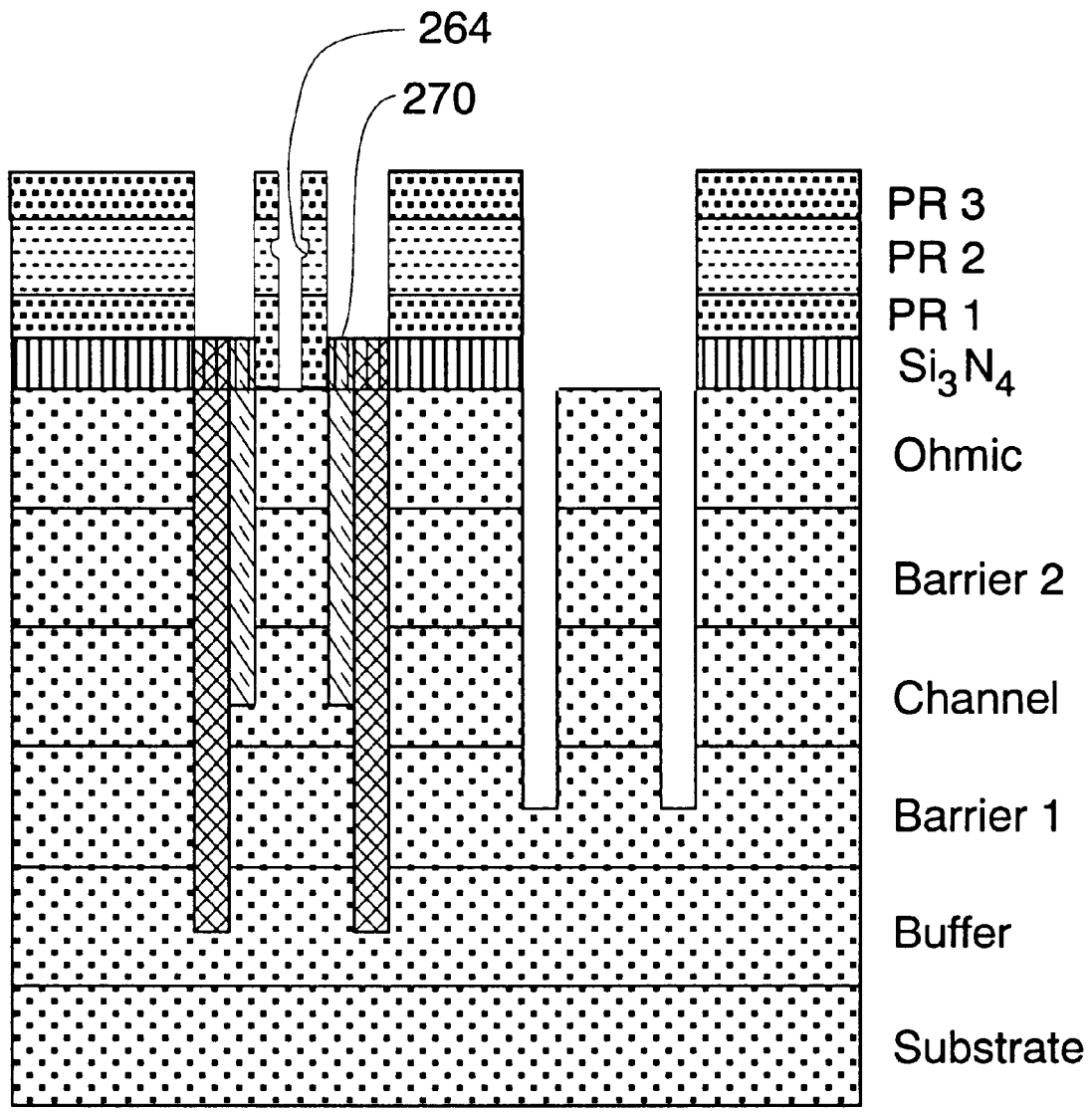
FIG. 2W shows the FIG. 2V structure after additional processing.
Figure 2X:
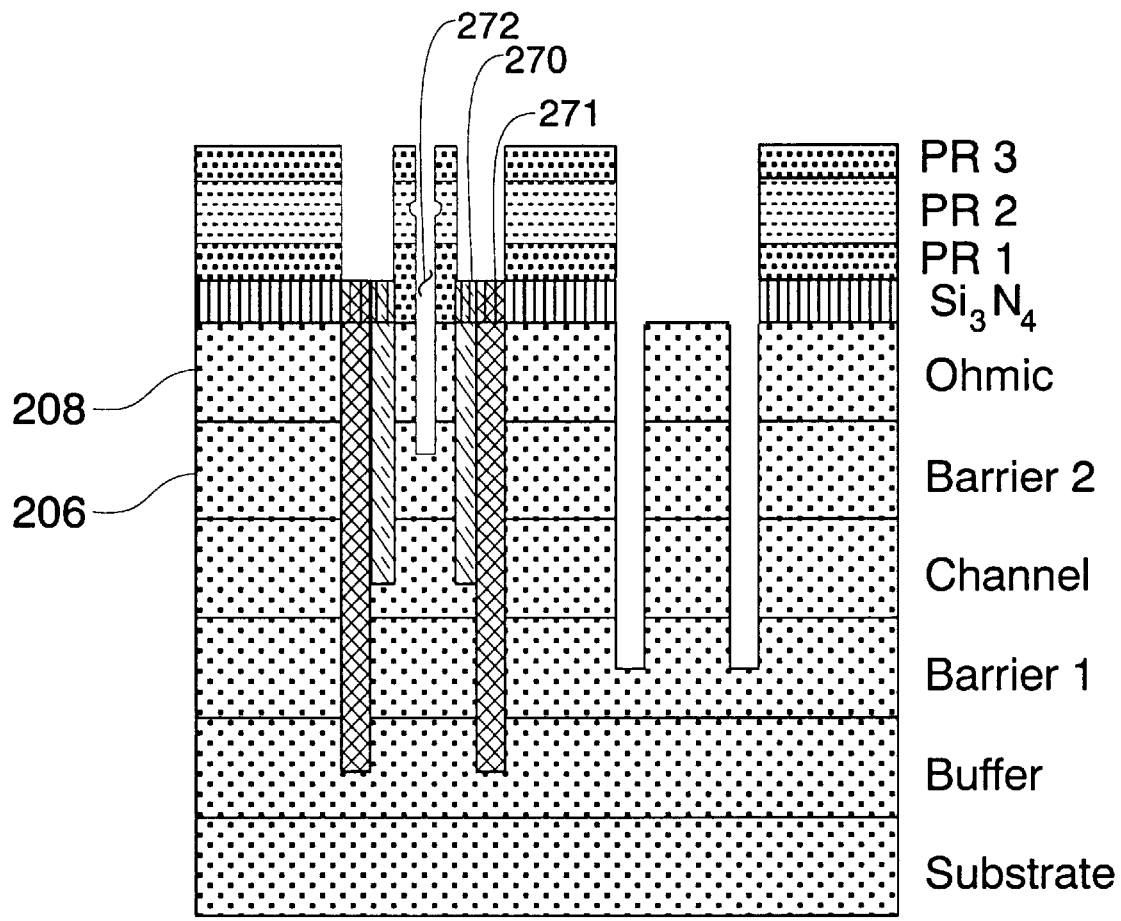
FIG. 2X shows the FIG. 2W structure after additional processing.
Figure 2Y:
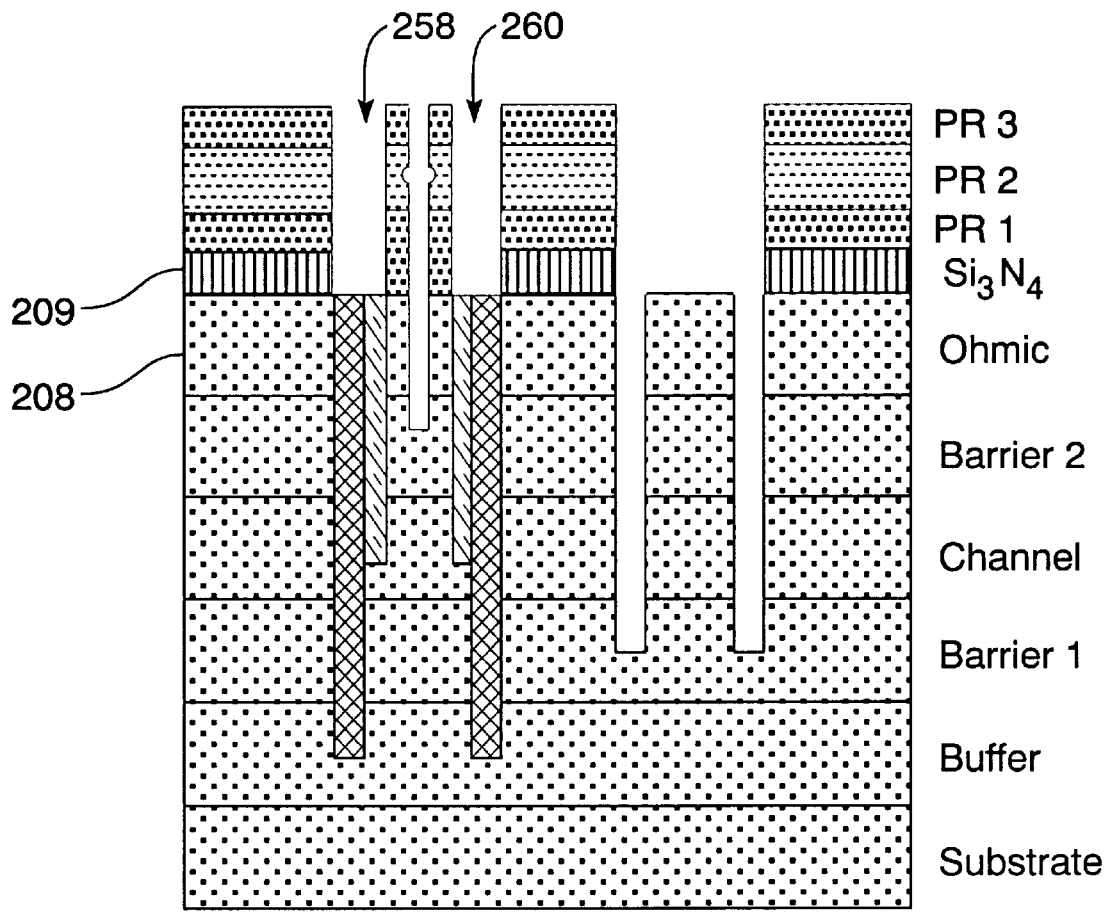
FIG. 2Y shows the FIG. 2X structure after additional processing.

Since the amount of photoresist remaining after accomplishment of the FIG. 2U development/stripping step is significant in determining quantitative parameters for use in subsequent FIG. 2 steps, in the FIG. 2Y reactive ion etch, for example, the present inventors often perform a thickness measurement of the photoresist material remaining in the region 262, for example, after completion of the acetone spraying used in the FIG. 2U step. With the initial photoresist thickness indicated above, for example, it is found desirable for the unexposed photoresist remaining after the FIG. 2U step to be at least 0.75 micron in thickness and for a rework of wafers (starting from the FIG. 2T step) not meeting this threshold to occur. A range up to 0.9 micron of remaining photoresist is commonly encountered in using the FIG. 2U step. A DETAK Corporation surface profilimeter may be used in measuring the combined layers 245, 247 and 248 photoresist thickness after the FIG. 2U step.

The FIG. 2U development or stripping step is preferably accomplished by spraying unused acetone solvent or developer onto the spinning FIG. 2U wafer, a step preferably accomplished at a spin rate of 500 revolutions per minute, at a temperature of 300 degrees Kelvin, using a spray operating pressure of twenty to thirty pounds per square inch and a separation distance of less than one inch between spray head and wafer. The spraying action is preferably accomplished over a time of thirty seconds and uses a total volume of virgin acetone less than fifty milliliters for a two or three inch wafer.

The FIG. 2V step represents the definition of gate geometry, i.e., the gate length, gates width and gate location for the FIG. 2 transistor. (Gate "length" here is again presumed, according to convention, to extend in the direction of charge carrier flow, e.g., from left to right in FIG. 2.) In the desired high resolution electron beam gate definition procedure this gate stripe geometry, including its FIG. 2V cross sectional shape as appears at 268 in the FIG. 2V drawing, is defined by the manner in which an electron beam is scanned over the combined layers 248, 247 and 245 of photoresist material in the gate region. A scanning pattern which will achieve the "top-heavy" mushroom-like gate cross section in the remainder of layer 247 and in layer 248 is desired since this gate cross sectional shape is found desirable for high frequency transistor use. Accomplishment of this electron beam scanning in the photoresist of layers 248, 247 and 245 is indicated at 268 in FIG. 2V by a vertical dotted line representation. Notably the steps for achieving this cross section as described below are cumulative in nature and do not require a costly sequence of exposing then developing in repeating cycles.

A number of different scanning patterns can be used to achieve the desired small footprint and larger topmost portions of a low electrical resistance and low electrical inductance mushroom-like gate stripe cross sectional shape. In the presently preferred of these scanning patterns for FIG. 2V, the electron beam is moved linearly to define the lowermost or mushroom stem region of the gate stripe and moved over a selected two dimensional pattern in the "tophat" or "umbrella" area of the mushroom. A connected series of small rectangle shapes is found to be satisfactory for this "tophat" or "umbrella" area electron beam exposure. Selection of the desired depth location where these two scanning patterns are traced by the electron beam is related to the desired gate geometry. Control of the beam spot size and current characteristic in the electron beam equipment may also be used in achieving the FIG. 2V illustrated shape or other shapes. A double scan pattern is found effective in achieving a shape of the type illustrated in each of the FIG. 2V and subsequent views of FIG. 2.

By way of a small discussion digression, location of the gate element in the FIG. 2V electron beam exposure is preferably determined by measurement from the alignment mark which first appears at 226 and 228 in the FIG. 2G drawing. This alignment mark is actually disposed in the form of a symmetrical cross of five micron "diameter" as is represented at 318 in the FIG. 3 plan view drawing. The FIG. 2 double vertical column representation of this cross 318 arises from the FIG. 2 drawings representing a cross sectional view taken along the cutting line 320 appearing in FIG. 3. As may be appreciated, therefore the individual FIG. 3 lines of the cross 318 are embodied as the one micron deep semiconductor material layer wells at 226 and 228 in FIG. 2G (hence two lines for two cross leg lines) and the centermost portion of the cross, as at 324 in FIG. 3, exists between the leg lines or wells 226 and 228. The perhaps unusually deep wells of the alignment mark cross 318 are desirable to provide easily recognized and accurate cross element identification to the electronic sensors used for its detection—in the layout equipment. Electron beam writing apparatus such as the JBX-5DII E-Beam system by the Japanese JEOL Limited corporation may, for example be used.

From an overall measurement accuracy perspective of the FIG. 2 process it may now be appreciated (in view of the FIG. 2V and FIG. 3 drawings and this discussion of wafer measurement techniques) that the transistor gate locations and the alignment mark 318 are first registered each with the other through use of the mask 201 in the FIG. 2B drawing. Then later, after much of the transistor fabrication is accomplished, the all important gate element itself is accurately included in this registration by measurements which use the same alignment mark as a reference point. This overall arrangement is regarded as being helpful in achieving several of the combination advantages of the present invention transistor, advantages including small and high frequency gate/transistor characteristics in a single metal device, a device moreover of the enhancement mode type.

It may now also be appreciated that a plurality of factors have been combined in defining the desired gate contact shape in this the EBOL related sequence. These factors include a combination of sensitivity difference between the films of the photoresist layers 245, 247 and 248, the dosing modulation achieved with linear and connected series of small geometry electron beam scanning patterns, the differing development responses and the distinguished energy profiles of the developers employed.

Returning again to FIG. 2V, the resolution and precisely controlled nature of the FIGR. 2V electron beam exposure sequence allows placement of the gate contact in the center of a gate window as represented in the FIG. 2 sequence or alternately allows precise placement closer to either source or drain contact as is desired in some transistor devices. The photoresist development used following the FIG. 2V exposure sequence involves a Methyl Iso Butyl Ketone and Isopropyl Alcohol, MIBK:IPA, developer mixture or may use a chlorobenzene developer. The topmost photoresist layer 249 has of course been stripped away prior to the MIBK:IPA development. The appearance of the gate contact mask after development of the exposed electron beam photoresist material of layers 245 and 247 (and remaining parts of the layer 248) is first represented in the FIG. 2W drawing.

It should be noted in the FIG. 2W drawing that development of the gate photoresist materials of layers 248, 247 and 245 occurs while the source and drain areas of the transistor remain protected from developer action by presence of the silicon nitride material "secondary mask" of layer 209, a mask existing in the regions covering the source and drain ion implanted paths, regions such as are identified at 270 in FIG. 2W. This protection of the source and drain areas by a material which has been present since the start of the FIG. 2 sequence, a material which has also permitted the accomplishment of two ion implant operations without requiring removal, and a material which serves to advantage in both the processing and in the finished transistor, is believed to comprise additional notable features of the herein described process and the transistor it achieves.

In the FIG. 2X drawing the results of using a selective etch step to remove a gate sized recess or well 272 in the ohmic contact layer 208 and into the barrier 2 layer 206 is represented. Selective etching of the indicated indium gallium arsenide and aluminum gallium arsenide materials of these layers may be accomplished using the citric acid/ hydrogen peroxide etch process identified in the FIG. 2X legend. The FIG. 2X etching preferably extends significantly into the barrier 2 layer 206, an extension of 50 angstroms into a barrier 2 layer of 250 angstroms total thickness being desired. The subsequently received gate metal is to be disposed in this 50 angstrom recess of the barrier 2 layer. An etchant composed of citric acid and hydrogen peroxide in the ratio between thirty to one and fifty to one citric acid to hydrogen peroxide may be used in the FIG. 2X step. Agitation and a temperature of 300 degrees Kelvin may be used for the citric acid etch. It is notable that the source and drain regions of the FIG. 2 transistor, the regions at 270 again remain protected by the secondary mask layer 209 during this FIG. 2X selective etch step. This protection is perhaps equal or even more important during the FIG. 2X etching than in the FIG. 2W development step.

FIG. 2Y represents accomplishment of a Freon® and Oxygen ion etching of the secondary mask layer 209 in the source and drain apertures 258/260. This etching using a reactive ion etch removes the silicon nitride secondary mask layer 209/210 and exposes the ohmic contact layer 208 material of the source and drain vertically disposed conductive paths (at 238 and 240 in FIG. 2L) in the transistor. Notably the material removed during this step, the material identified at 270 and 271 in FIG. 2X, for example, is silicon nitride material which has been subjected to different ion implant doping operations. (The material at 270 has been implanted with charge carrier doping and the material at 271 implanted with conductivity inhibiting oxygen ions.) In view of these dopings the material at these locations was in fact represented as ion implanted material in the drawing symbols.

In view of the somewhat unpredictable and physically resistant nature of the two different ion implanted silicon nitride materials in these regions, use of the perhaps extreme measure of a reactive ion etch to remove this material is found desirable. Damage to the underlying semiconductor material of the ohmic contact layer is avoided by careful control of the reactive ion etch, by the somewhat rugged nature of the ohmic contact layer material and by reducing the reactive ion pressure to limit the etch rate achieved. The FIG. 2Y etch may be accomplished, for example, using a time of two to three minutes under a pressure of forty millitorr with a flow of 45/2 sccm mix materials as described above and at a temperature of 300 degrees Kelvin.

The protective function of the layer 209 material especially during the later FIG. 2 steps suggests, as indicated above, reference to this material as a secondary mask layer. Identification of this protective function also enables a better understanding of the importance of the secondary mask in achieving transistor devices according to the present invention. Without the separate but jointly present in FIG. 2Y and FIG. 2Z masks for the source and drain implanted paths, a delicate mask realignment step and separate distinct metallization operations for these regions would be required—as is the present state of the field-effect transistor fabrication art. (It is particularly notable, for example, that the process of the above identified U.S. Pat. No. 4,961,194 of S. Kuroda et al., does not include the secondary mask layer 209 and does contemplate separate metallization steps). In addition to enabling a single common metallization step, the absence of a realignment step is particularly desirable in the gate region of a field-effect transistor since accurate gate placement is needed to obtain optimum performance from a fabricated device.

Figure 2Z:
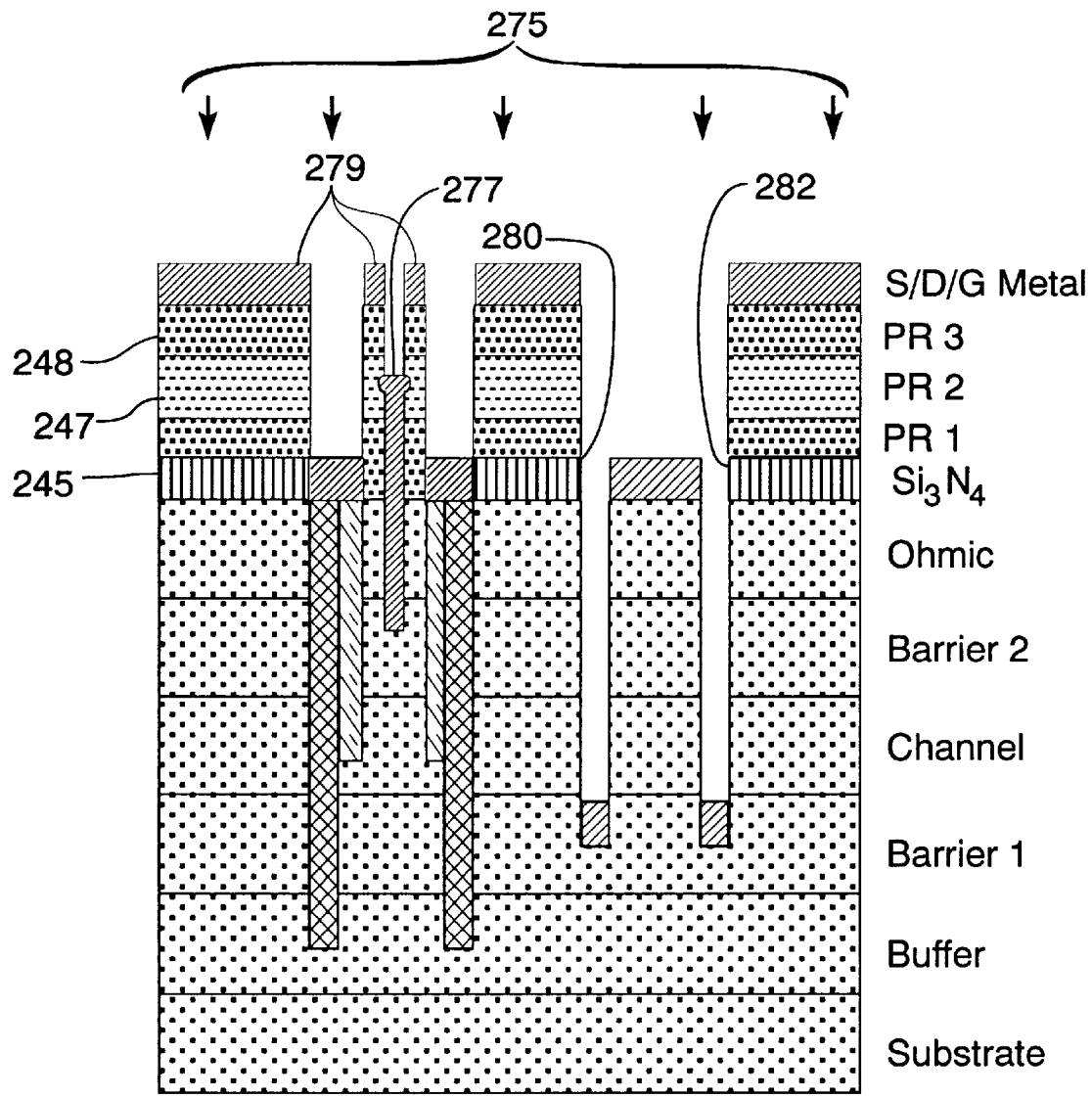
FIG. 2Z shows the FIG. 2Y structure after additional processing.
Figure 2A:
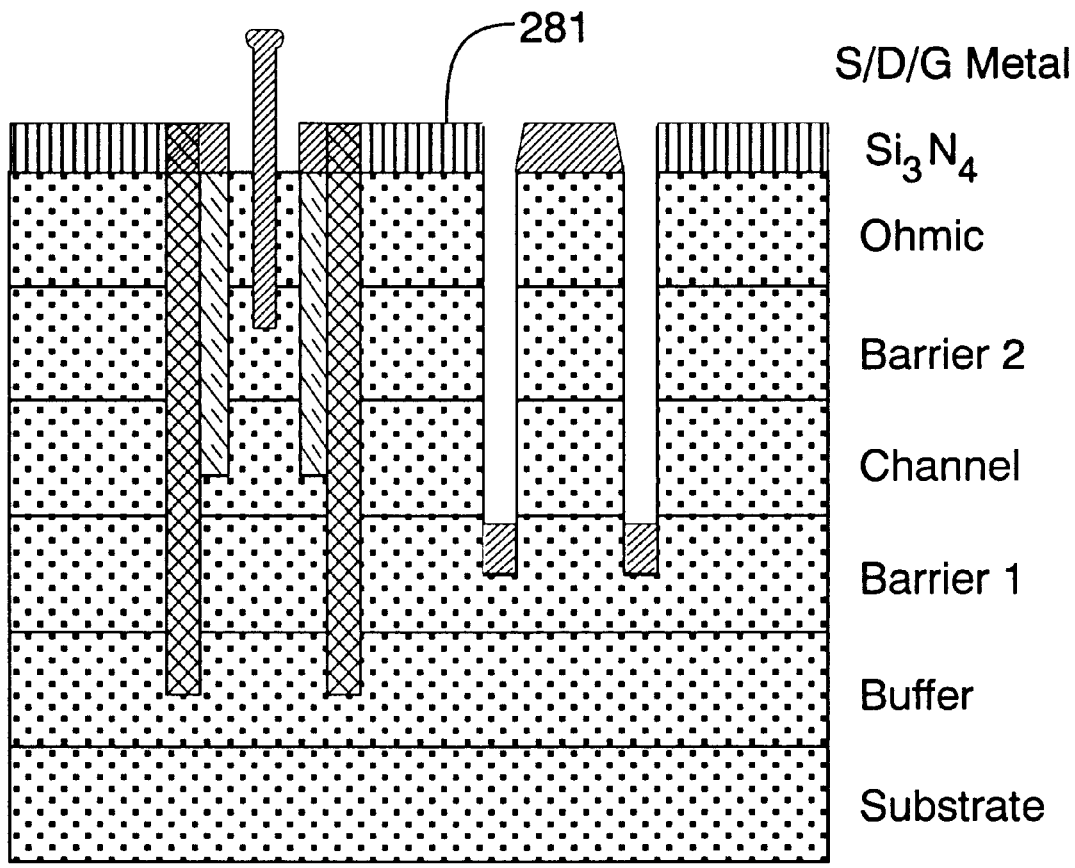

With the source/drain and gate regions of the FIG. 2Y device exposed, a single deposition of metal as represented at 275 in FIG. 2Z can be accomplished. A metal scheme of titanium and gold in the respective thicknesses of 200:5800 angstroms is found desirable for this purpose. Alternately a metal scheme of titanium platinum and gold in the respective thicknesses of 200:500:5300 may also be used. Other metal combinations including a combination of nickel and gold may also be usable in this step. Metals forming both a Schottky contact to the gallium arsenide, or other selected group III-V gate region semiconductor material, and an ohmic contact to the ohmic layer mixture of this semiconductor material and which can be deposited by evaporation can potentially be used in the metallization step—so long as the metal and its processing do not degrade the underlying materials during deposition. This metallization step forms the gate element or gate contact 277 in FIG. 2Z and also deposits metal at 279 over the top surface of the FIG. 2Z structure as shown. The titanium metal used in these metallizations is applied first and serves primarily in an adhesion improvement role. A total thickness near the indicated 6000 angstroms is desirable in view of the photoresist thickness dimensions provided above and in view of the later metal lift-off step wherein metal break regions are needed.

The titanium and gold or titanium platinum and gold metallizations identified in connection with the FIG. 2Z and FIG. 2AA steps are herein referred to using the term "single metal" or similar language; such language in fact also appears in the claims of this document. Use of two or three different metals as described in connection with FIG. 2Z and FIG. 2AA could be viewed as a stretching of this term "single metal" in some senses, especially since the metals are not alloyed but used in separate and distinct layers. Use of the term "single metal" is, however, believed fair and proper in the present invention in view of the fact that the different metallizations in the FIG. 2Z and FIG. 2AA device may be deposited in a single deposition sequence. These multiple metal depositions in fact may be accomplished during a single metallization chamber evacuation wherein an electron beam is sequentially directed at the two or three different metal targets needed to supply the required titanium and gold or titanium platinum and gold metallizations. Moreover, the term "single metal" also has additional meaning in the present invention setting in the sense that this single deposition sequence is used to accomplish both the source/drain and gate metal areas of the device, since these areas are of the same metallic composition according to the invention.

By way of the differing semiconductor materials and doping concentrations present in the source/drain and gate regions of the FIG. 2 device, i.e., present below the FIG. 2Y metallizations, the desired ohmic contact electrical characteristics are obtained at the source/drain contact regions and a Schottky barrier electrical characteristic is obtained at the gate contact region with this single metallization step. Since the FIG. 2X photoresist pattern is used both as the gate recess etch mask in FIG. 2X and as the gate metal definition mask in the FIG. 2Z step, the gate metal is moreover self-aligned to the etched gate recess region in the transistor barrier 2 layer—as is also desired for achieving the optimum alignment which enables best transistor yield and performance.

The FIG. 2Z metallization step may be additionally used to form the interconnecting conductors of the transistor including the gate feed and pad regions. For such interconnecting conductor formation it is desirable that usable metal beaks exist adjacent the gate, source and drain metallizations in FIG. 2Z since a metal lift-off-step is used subsequently in FIG. 2AA to remove any metal supported only by photoresist mask material. Such metal breaks in fact occur in the FIG. 2Z structure in view of the illustrated deep photoresist wells surrounding the gate, source and drain metallizations and in view of the tendency of the photoresist material at the top corner of these wells to extend over the well wall to a small degree. Similarly the metallization step itself tends to build an overly rounded corner also extending over the well wall to a small degree. As is known in the lithography art, an over development of the image in the photoresist layer 248 may also be used to achieve a lip or overhang or cliff region useful for this metal break purpose.

Removal of the three photoresist layers 245, 247 and 248 is represented in the FIG. 2AA drawing. This removal also accomplishes the metal lift-off separation of undesired metal from desired metal by way of the lip or overhang or cliff regions described previously. Following such metal lift-off the FIG. 2AA device is complete and ready for known device packaging or incorporation procedures.

The structure shown in the FIG. 2 drawing represents cross sectional views of the transistor in the manner which is somewhat traditional in the art for showing the fabrication of semiconductor devices. These cross sectional representations, however, convey little information regarding the plan view or third dimension shape and size details of the transistor. In the instance of the presently disclosed transistor, for example, emphasis is placed on the achievement of transistor devices which afford significant microwave and other high frequency transistor performance characteristics. The achievement of these characteristics inevitably influences the plan view configuration of the transistor as may be appreciated by reference to the drawing views of FIG. 3 and FIG. 4. In these drawings two types of transistors disposed according to the present invention are shown in plan view representations. The FIG. 3 and FIG. 4 drawings may be viewed as representations of either mask drawings or microphotographs of present invention-fabricated transistor devices formulated according to the drawing rules of U.S. Patent practice.

Figure 3:
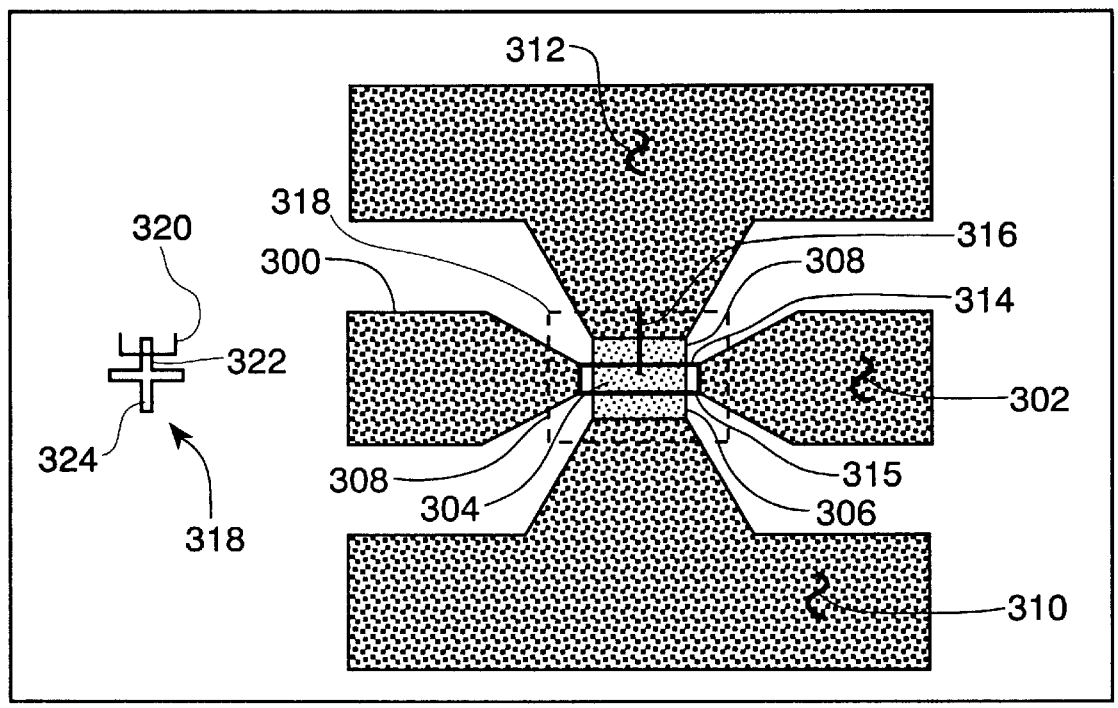
FIG. 3 shows a first plan view representation of a transistor according to the invention.

In the FIG. 3 drawing there is therefore shown a plan view representation of one microwave transistor layout which has become popular with manufacturers and users, a "dual finger transistor" a transistor disposed in the "ground signal ground" configuration found to be convenient for both device testing prior to packaging and for incorporation into certain integrated circuit structures. In a similar manner FIG. 4 in the drawings shows a second transistor layout which has become popular with manufacturers and users, a "single center fed" transistor configuration—a transistor also shown in the "ground-signal-ground" configuration. Each of these transistor layouts are believed fairly represented by the cross sectional views of FIG. 2 in the manner described below. Twenty six gigahertz testing and use of devices according to these fabrication and layout arrangements is considered representative and is believed not to represent an upper cutoff frequency for the devices achieved.

In the FIG. 3 dual finger transistor the drain element appears at 304 and the electrically common drain connection pad is shown at 300. In a somewhat related manner transistor source elements appear at both 306 and 308 in the FIG. 3 device and the source contact pads which are also two in number in the FIG. 3 device configuration appear at 310 and 312. Usually these two source contact pads are connected together by external conductors when the FIG. 3 device is received in a microwave or other utilization circuit. (These name to drawing FIG. relationships involving source and drain should be taken as exemplary in the sense that source and drain elements of a field-effect transistor are often interchangeable in so far as electrical performance of the transistor is concerned.) The dark stripes appearing at 314 and 315 in the FIG. 3 drawing represent the gate stripe conductor of the transistor, i.e. the metal stripe which makes electrical contact with the semiconductor material underlying the FIG. 3 elements; this gate stripe when fabricated according to the manner preferred in the present invention is provided with a mushroom shaped cross section in order to achieve desirable microwave or other high frequency transistor characteristics. The gate contact pad connecting with the gate stripe conductors appears at 302 in the FIG. 3 drawing. In testing the FIG. 3 transistor while it remains on an undivided semiconductor wafer, it is often convenient to ground the two source contact pads 310 and 312, apply signal at the gate pad 302 and concurrently apply operating potential and collect output signal at the drain pad 300. In this arrangement both the left and right hand sides of the transistor or the input port and output ports of the transistor may be referred to as being in a ground-signal-ground configuration.

Figure 4:
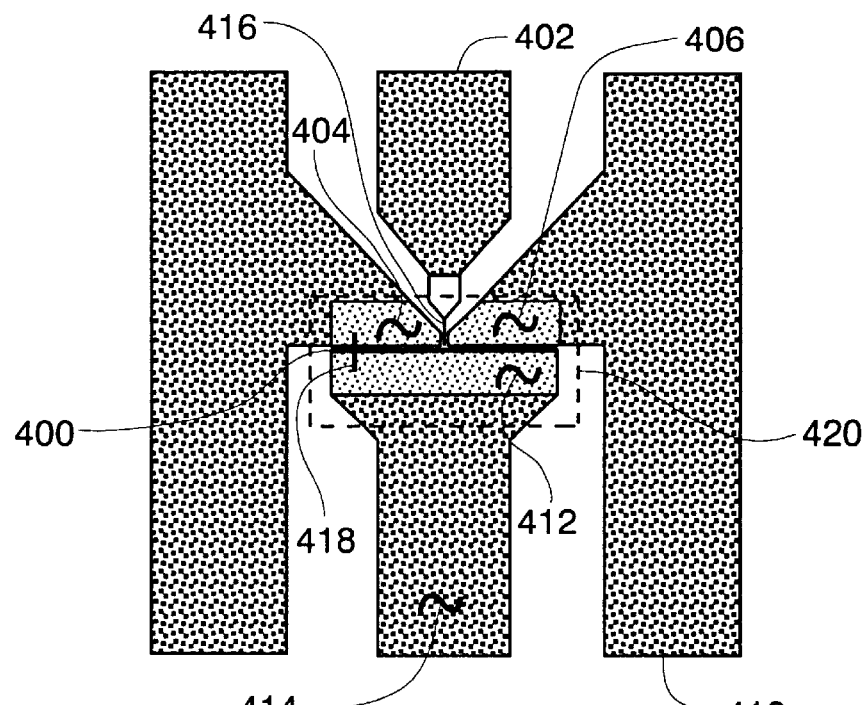
FIG. 4 shows a plan view representation of a second transistor according to the invention.

In the single center fed high frequency transistor of FIG. 4 a somewhat similar situation prevails. In the FIG. 4 transistor two source regions located at 404 and 406 are also present together with a single drain region located at 412. The two source contact pads appear at 408 and 410 in the FIG. 4 drawing and the single drain contact pad at 414. The gate stripe element in the FIG. 4 transistor appears at 400 and is center fed from the gate contact pad 402 by the gate connecting stripe shown at 416. The same mushroom gate cross section and ground-signal-ground signal port arrangements described for the FIG. 3 transistor are also relevant to the FIG. 4 transistor. One aspect of the present invention transistor in fact involves the metal of the pads 402, 408, 410 and 414 in the FIG. 4 transistor and the metal of the gate stripe 400 being all composed of the same metal—despite the ohmic and Schottky barrier relationships needed at source/drain and gate contacts respectively. A similar concept prevails for the FIG. 3 transistor.

To one having general familiarity but not, for example, semiconductor foundry experience with field effect transistor devices, a consideration of the FIG. 3 and FIG. 4 transistor arrangements may reasonably raise several questions regarding the transistor representations shown in the various drawings of the present document—expressly including the FIG. 3 and FIG. 4 drawing arrangements. A first of these questions may well involve how the large appearing and complexly structured transistors shown in plan view in the FIG. 3 and FIG. 4 drawings can be fairly represented by the somewhat simple cross sectional views of the FIG. 2 fabrication sequence. A first part of the answer to this question involves the mental step of disregarding each of the metal connection pads shown in the FIG. 3 and FIG. 4 transistors, since these are surface located elements, and focusing on the central portion of the FIG. 3 and FIG. 4 devices.

In these central portions of the FIG. 3 and FIG. 4 drawing transistors it may be appreciated that the cross section views of FIG. 2 represent transistor structure which extends downward from the plane of the FIG. 4 drawing into the drawing page and therefore underlies the transistor elements of FIG. 3 or FIG. 3 and FIG. 4. Moreover, it may be appreciated that the cross sectional representations of a single transistor in the FIG. 2 drawing, therefore, appear as a relatively small region in the FIG. 3 transistor, e.g., appear as the FIG. 3 drawing portion underlying or hidden by the short vertical line 316 in FIG. 3 or the similar line appearing at 418 in FIG. 4 (i.e., each FIG. 2 transistor cross section is actually represented by a single short line in the FIG. 3 and FIG. 4 device views—again the cross section lies within the page of the FIG. 3 drawing covered by the lines 316 and 418 for example). Clearly, therefore, the FIG. 2 drawing cross sections may equally well represent other similarly disposed portions of the FIG. 3 and FIG. 4 transistors. According to this drawing relationship it may therefore be understood that the FIG. 2 cross sectional views are representative of typical cross sections from the FIG. 3 and FIG. 4 transistors, cross section portions which may exist at almost any location in the active area of a FIG. 3 or FIG. 4 device.

Another aspect of the transistor appearing in the FIG. 2 cross sectional views may also be better appreciated with the aid of the FIG. 3 drawing; this aspect concerns the oxygen ion implanted electrical isolation areas shown, for example, at 242, and 246 in the FIG. 2O drawing. Typical plan view shape and extent details of these isolation regions are represented by the dotted line 318 in the FIG. 3 drawing and the similar dotted line at 420 in the FIG. 4 drawing. As thus represented this electrical isolation region generally surrounds each transistor and thereby electrically insulates each layer of the transistor from component parts of the adjacent transistor, from transistor interconnection wiring and from the bulk semiconductor material of the wafer. As indicated in the FIG. 3 and FIG. 4 drawings, the metallic connecting pads associated with the transistor elements generally extend over and exist outside the bounds of the implanted isolation regions at 308 and 420. These pad areas and other metallizations attending a transistor are in fact electrically insulated from underlying semiconductor material at least in part by remaining portions of the silicon nitride masking layer 209 of the present invention. Such a remaining part of this layer appears at 281 in the FIG. 2AA drawing. Such electrical insulation is therefore an additional use of the silicon nitride material layer 209/210 according to the present invention.

The total dose ionized radiation hardness of gallium arsenide field-effect transistors is considered to be good in comparison with silicon based field-effect transistors since a radiation-susceptible oxide layer is usually not present in a gallium arsenide device. In response to a total dose radiation exposure of ten to the eighth power ($10^8$) rads, for example, the threshold shift response of gallium arsenide MESFET devices is often measured in millivolts of change in comparison with shifts of one volt range often encountered for silicon based MOSFET devices receiving total doses of two orders lower magnitude, i.e., ten to the sixth power ($10^6$)

rads. The complementary heterostructure form of the gallium arsenide transistor, i.e., a pair of devices of the type disclosed herein, has been found even more tolerant of ionizing radiation and in fact has demonstrated a two orders of magnitude improvement over ordinary gallium arsenide devices when compared on the basis of errors per bit-day in digital uses. When used as analog devices such transistors have demonstrated only slight changes in gain, leakage current and rise times with total dose radiation measured in the $10^{15}$ rads range. Devices of the type described herein are therefore considered desirable for deep space and other radiation susceptible uses.

By way of reflection and summarization, the elimination of steps involving metallization and its attending lithography from the present process represents notable time and cost savings. The hours of time involved in accomplishing an accurate mask alignment, the time to evacuate a metallization chamber, the time to accomplish the metallization, and then the time to relieve the vacuum at a controlled rate typically combine to impact fabrication throughput when multiple metallization are involved for a device. Many etching steps in comparison are of significantly lower cost than a metallization step and therefore are of less significance in device fabrication time and bottom line cost.

By way of additional comparisons relating to the present invention, it is recognized that conventional transistors make use of the well known gold germanium nickel ohmic contact and thereby achieve what is considered to be desirable low electrical resistance at these contacts. It is further recognized that the presently espoused use of Schottky metallization, i.e., the herein disclosed titanium gold for this ohmic contact function, may be considered an area of device performance compromise, in which somewhat higher source and drain contact resistance can result. With the herein disclosed arrangement of the ohmic contact semiconductor layer of the transistor this tendency toward greater contact resistance is, however, limited to a degree believed acceptable in many field-effect transistor uses.

The desired reward for acceptance of any compromise of this nature is of course realized in the simplification of device processing, probably increased wafer yields and the resulting decrease in device cost. The employment of a single metallization step is of course a notable area of present processing simplification. A significant enabling factor in achieving this single metallization involves use of the relatively inert secondary mask element and the separation of gate region fabrications steps from source and drain region fabrication steps it makes possible.

Another area of present processing simplification which may be viewed as the acceptance of device-impacting compromise resides in the area of combined electron beam and optical lithography steps in a single device. While conventional wisdom may suggest the maintenance of separation between processes involving these two exposure arrangements is desirable to avoid their compromising interaction, the present inventors believe the combination of these exposures as disclosed herein and in the literature is sufficiently well tuned so as to have little negative effect on the resulting devices.

Another present process enhancement concerns a selective gate recess etch, which allows for unusually desirable control of the gate. Typically, gate recess etching is performed in an iterative, "etch to a target current" process. The present process however, discloses a gate etch that can be accomplished without probing the ohmic contacts and thereby allows the ohmic contacts to be covered with protective $Si_3N_4$ during the gate recess etch. Additionally, the present process prevents problems with metal step coverage or metal to metal overlap, problems whose elimination relate closely to yield improvement.

Yet another feature of the disclosed fabrication is the use of a non-alloy ohmic metal process which further improves device uniformity and eliminates an undesirable high temperature processing sequence. The present process also requires only one dielectric deposition step instead of two as in the best existing technique. Metal definition in the disclosed process is by lift-off and not by the more expensive ion milling. This metal lift-off requires no expensive equipment, and does not introduce damage or transistor performance degradation. Finally the employed process for this device is also compatible with monolithic microwave integrated circuit (MMIC) and other fabrication techniques and minimizes process variations, cycle time, and cost.

The present invention is therefore believed to represent the first ever GaAs based enhancement mode transistor using a single metallization scheme for both the Schottky gate and ohmic contacts. The transistor is again achieved through integration of the electron-beam/optical lithography process, selective gate recess etching, and non-alloyed ohmic contacts. The disclosed transistor greatly simplifies the fabrication of FET devices while minimizing process variations. The described transistor arrangement is also believed feasible for lower frequency amplifier transistors.

While the apparatus and method herein described constitute a preferred embodiment of the invention, it is to be understood that the invention is not limited to this precise form of apparatus or method and that changes may be made therein without departing from the scope of the invention which is defined in the appended claims.

What is claimed is:

1. A periodic table group III-V semiconductor material enhancement mode field-effect transistor comprising the combination of:

a plurality of undoped periodic table group III-V semiconductor material layers received on a substrate member;

a masking inorganic dielectric material layer covering an outermost of said semiconductor material layers and having selected mask apertures therein;

said masking dielectric material layer-covered semiconductor material layers including a buried, charge carrier-communicating, field-effect transistor channel layer;

a gate window aperture through at least one semiconductor layer covering said channel layer, said gate window aperture being in registration with one of said masking inorganic dielectric material layer mask apertures;

a Schottky barrier gate element received in charge carrier flow-controlling proximity of said channel layer in said gate window aperture;

source and drain current conductor elements located on charge carrier flow upstream and downstream sides of said gate window aperture and each comprising aligned stacks of locally doped successive layer semiconductor material extending between stack ends at said outermost semiconductor material layer and said channel layer;

source and drain ohmic contact elements received on said outermost semiconductor material layer each in registration with other non-gate of said mask apertures and in electrical connection therein with one of said current conductor outermost semiconductor material layer stack ends;

said gate element and said source and drain ohmic contact elements being comprised of a same metallic common composition.

2. The enhancement mode field-effect transistor apparatus of claim 1 wherein said periodic table group III-V semiconductor material layers are comprised of gallium arsenide and said gate element and said source and drain ohmic contact elements are comprised of titanium and gold metal.

3. The enhancement mode field-effect transistor apparatus of claim 1 wherein said masking inorganic dielectric material layer is comprised of one of the materials of silicon nitride and silicon dioxide.

4. The enhancement mode field-effect transistor apparatus of claim 1 wherein:
   said plurality of undoped periodic table group III-V semiconductor material layers comprise a substrate-received buffer layer, a buffer layer-received barrier one layer, a barrier one layer-received channel layer, a channel layer-received barrier two layer and a barrier two layer-received ohmic contact layer; and
   said substrate-received semiconductor material layers are comprised of three thousand Angstroms thick gallium arsenide material, two hundred Angstroms thick aluminum gallium arsenide, one hundred twenty five Angstroms thick indium gallium arsenide, two hundred fifty Angstroms thick aluminum gallium arsenide, and one hundred to three hundred Angstroms thick indium gallium arsenide materials respectively.

5. The enhancement mode field-effect transistor apparatus of claim 4 wherein said gate window aperture passes through said ohmic contact layer into a receptacle for said gate element disposed in said barrier two layer.

6. The enhancement mode field-effect transistor apparatus of claim 1 wherein said source and drain current conductor elements comprise ion implant locally doped successive layer semiconductor material and wherein said ion implant doping and said charge carriers are each hole type carriers and said enhancement mode transistor is a p-channel field-effect transistor.

7. The enhancement mode field-effect transistor apparatus of claim 1 wherein said source and drain current conductor elements comprise ion implant locally doped successive layer semiconductor material and wherein said ion implant doping and said charge carriers are each electron type carriers and said enhancement mode transistor is an n-channel field-effect transistor.

8. The enhancement mode field-effect transistor apparatus of claim 1 wherein said apparatus comprises a partially completed field-effect transistor also having a stacked plurality of photoresist material layers received over said masking inorganic dielectric material layer and wherein said metallic Schottky barrier gate element is received in a electron beam lithography-shaped gate aperture located within said stacked plurality of photoresist material layers in registration with said semiconductor layer gate window aperture.

9. The enhancement mode field-effect transistor apparatus of claim 1 wherein said plurality of undoped periodic table group III-V semiconductor material layers comprise a substrate-received buffer layer, a buffer layer-received channel layer and a channel layer-received ohmic contact layer.

10. The enhancement mode field-effect transistor apparatus of claim 1 wherein said plurality of undoped periodic table group III-V semiconductor material layers comprise a substrate-received buffer layer, a buffer layer-received barrier one layer, a barrier one layer-received channel layer, a channel layer-received barrier two layer and a barrier two layer-received ohmic contact layer.

11. A single metal enhancement mode periodic table group III-V semiconductor material field-effect transistor comprising the combination of:
   a lowermost-situated group III-V semiconductor material substrate layer;
   an undoped group III-V semiconductor material buffer layer overlaying said substrate layer;
   an undoped group III-V semiconductor material first barrier layer, of larger energy bandgap semiconductor material than said semiconductor material buffer layer, overlaying said buffer layer;
   an undoped charge carrier-conveying group III-V semiconductor material channel layer overlaying said first barrier layer;
   an undoped group III-V semiconductor material second barrier layer, of larger energy bandgap semiconductor material than said semiconductor material channel layer, overlaying said channel layer;
   an undoped layer of ohmic contact group III-V semiconductor material, of metal-like small energy bandgap, overlaying said second barrier layer;
   a field-effect transistor gate member of first metallic composition received on said second barrier layer in registration with a gate aperture region of said ohmic contact layer and in charged carrier controlling proximity with said channel layer, said first metallic composition gate member being of a Schottky barrier electrical characteristic with respect to said second barrier layer semiconductor material;
   source and drain-related doped semiconductor material current path conductors located on flowing charged carrier upstream and downstream sides of said gate member, and extending through said ohmic contact layer and said second barrier layer, to field-effect transistor source and drain regions also disposed on conveyed charged carrier upstream and downstream sides of said gate member within said channel layer;
   source and drain contact members of said same first metallic composition received adjacent said ohmic contact group III-V semiconductor material layer over source and drain-related doped current path conductor regions thereof, said source and drain contact members being of an inherently ohmic and linear current-voltage electrical characteristic with respect to said doped charged carrier-conductive path semiconductor material of said ohmic contact layer.

12. The single metal enhancement mode periodic table group III-V semiconductor material field-effect transistor of claim 11 wherein said group III-V semiconductor material is gallium arsenide.

13. The single metal enhancement mode periodic table group III-V semiconductor material field-effect transistor of claim 11 wherein said source and drain-related doped semiconductor material current path conductors extending through said ohmic contact layer and said second barrier layer to field-effect transistor source and drain regions within said channel layer are comprised of vertically aligned regions of annealed ion implanted doped semiconductor material of said ohmic contact layer, said second barrier layer and said channel layer.

14. The single metal enhancement mode periodic table group III-V semiconductor material field-effect transistor of claim 11 wherein said gate contact member has a mushroom shaped cross section of enhanced radio frequency electrical characteristic.

15. The single metal enhancement mode periodic table group III-V semiconductor material field-effect transistor of claim 11 wherein said first metallic composition comprises one of the metal combinations of titanium and gold and titanium platinum and gold.

16. The single metal enhancement mode periodic table group III-V semiconductor material field-effect transistor of claim 11 wherein said source and drain-related doped semiconductor material current path conductors are two in number and are each comprised of positionally aligned thermally activated ion implant-doped semiconductor material extending through each of said ohmic contact layer and said second barrier layer into said channel layer.

17. The single metal enhancement mode periodic table group III-V semiconductor material field-effect transistor of claim 11:

further including an inorganic electrical insulating/secondary mask/photo-insensitive/passivation layer received over said ohmic contact group III-V semiconductor material layer in regions surrounding said source and drain-related doped current flow conductors and gate contact members; and wherein said source and drain contact members of said first metallic composition received adjacent said ohmic contact group III-V semiconductor material layer are also received in recess apertures of said electrical insulating/secondary mask/photo-insensitive/passivation layer.

18. The single metal enhancement mode periodic table group III-V semiconductor material p-channel field-effect transistor of claim 11 further including a doped electrical isolation region extending through a plurality of said semiconductor material layers surrounding said field-effect transistor.

19. The single metal enhancement mode periodic table group III-V semiconductor material field-effect transistor of claim 18 wherein said doped electrical isolation region is comprised of electrically insulating ion implanted semiconductor material.

20. The single metal enhancement mode periodic table group III-V semiconductor material field-effect transistor of claim 11 wherein said doped semiconductor material current path conductors each include a low electrical contact resistance portion characterized by a semiconductor material dopant concentration peak located adjacent said ohmic layer surface.

21. The single metal enhancement mode periodic table group III-V semiconductor material field-effect transistor of claim 11 wherein said charge carriers are electrons and said enhancement mode field-effect transistor is an n-channel field-effect transistor.

22. The single metal enhancement mode periodic table group III-V semiconductor material field-effect transistor of claim 11 wherein said charge carriers are semiconductor hole charge carriers and said enhancement mode field-effect transistor is an p-channel field-effect transistor.

23. A partially fabricated group III-V semiconductor material enhancement mode field-effect transistor comprising the combination of:

a lowermost-situated substrate layer;

a group III-V semiconductor material buffer layer overlaying said substrate layer;

a charged carrier conveying group III-V semiconductor material channel layer overlaying said buffer layer;

a group III-V semiconductor material barrier layer, of larger energy bandgap semiconductor material than said channel semiconductor material layer, overlaying said channel layer;

a layer of ohmic contact group III-V semiconductor material, of metal-like small energy bandgap, overlaying said barrier layer;

a field-effect transistor gate member of first metallic composition and selected cross sectional shape extending through a gate aperture recession region of said ohmic contact layer, to a well region of said barrier layer, said gate contact member being of a Schottky barrier electrical characteristic with respect to said barrier layer semiconductor material;

source and drain current conductor members comprised of stacked locally doped semiconductor layer regions extending from said ohmic contact layer through said barrier layer to said channel layer at charged carrier flow path locations preceding and succeeding said gate member;

an inorganic electrical insulating/secondary mask/photo-insensitive passivation layer received over said ohmic contact group III-V semiconductor material layer in regions surrounding said metallic field-effect transistor gate member and said source and drain contact members;

source and drain contact members of said same first metallic composition received on said source and drain current conductor member locally doped regions of said ohmic contact semiconductor material layer in said locations preceding and succeeding said gate member, said source and drain contact members being of an ohmic linear current-voltage electrical characteristic with respect to said ohmic contact layer doped source and drain current conductor members semiconductor material;

a patterned expendable multiple layered coating of differing photoresist materials received over selected remainder portions of said inorganic electrical insulating/secondary mask/photo-insensitive passivation layer and exposed portions of said ohmic contact group III-V semiconductor material layer.

24. The partially fabricated group III-V semiconductor material enhancement mode field-effect transistor of claim 23 further including an additional barrier layer of semiconductor material overlaying said buffer layer of semiconductor material, said additional barrier layer being overlaid by said channel layer.

25. The partially fabricated group III-V semiconductor material enhancement mode field-effect transistor of claim 24 wherein:

said substrate-received semiconductor material layers are comprised of gallium arsenide, aluminum gallium arsenide, indium gallium arsenide, aluminum gallium arsenide, and indium gallium arsenide materials respectively;

said gate member of first metallic composition and selected cross sectional shape is comprised of titanium and gold metal of mushroom shaped cross section;

said inorganic electrical insulating/secondary mask/photo-insensitive passivation layer is comprised of silicon nitride material; and said patterned expendable multiple layered coating of differing photoresist materials includes a layer of electron beam-compatible photoresist material.

* * * * *

UNITED STATES PATENT AND TRADEMARK OFFICE
CERTIFICATE OF CORRECTION

PATENT NO. : 6,066,865  
DATED : May 23, 2000  
INVENTOR(S) : Charles L.A. Cerny et al.

Page 1 of 1

It is certified that error appears in the above-identified patent and that said Letters Patent is hereby corrected as shown below:

Title page,
Item [57], Abstract, line 1, "III-IV" should read --- III-V ---.

Column 7,
Line 48, "III-IV" should read --- III-V ---.

Signed and Sealed this

Nineteenth Day of February, 2002

Attest:

JAMES E. ROGAN  
*Director of the United States Patent and Trademark Office*

*Attesting Officer*